United States Patent
Son et al.

(10) Patent No.: US 12,402,316 B2
(45) Date of Patent: Aug. 26, 2025

(54) SEMICONDUCTOR DEVICE AND DATA STORAGE SYSTEM INCLUDING THE SAME

(71) Applicant: Samsung Electronics Co., Ltd., Suwon-si (KR)

(72) Inventors: Yonghoon Son, Yongin-si (KR); Junhyoung Kim, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 681 days.

(21) Appl. No.: 17/721,533

(22) Filed: Apr. 15, 2022

(65) Prior Publication Data
US 2022/0399360 A1  Dec. 15, 2022

(30) Foreign Application Priority Data
Jun. 11, 2021  (KR) .......... 10-2021-0075945

(51) Int. Cl.
| H10B 43/40 | (2023.01) |
| H10B 41/10 | (2023.01) |
| H10B 41/27 | (2023.01) |
| H10B 41/35 | (2023.01) |
| H10B 41/40 | (2023.01) |
| H10B 43/10 | (2023.01) |

(Continued)

(52) U.S. Cl.
CPC ............ *H10B 43/40* (2023.02); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search
CPC ........ H10B 43/40; H10B 43/10; H10B 43/27; H10B 43/35; H10B 41/10; H10B 41/27; H10B 41/35; H10B 41/50; H10B 43/20; H10B 43/50

See application file for complete search history.

(56) References Cited

U.S. PATENT DOCUMENTS 10,141,329 B2   11/2018  Tsuda et al.
10,163,924 B2 *  12/2018  Ahn .................. H10B 41/27
(Continued)

FOREIGN PATENT DOCUMENTS

CN  111430365 A   7/2020
CN  111755454 A   10/2020
(Continued)

OTHER PUBLICATIONS

Korean Office Action dated Apr. 4, 2025 issued in Korean Patent Application No. 10-2021-0075945.

*Primary Examiner* — Michael M Trinh
(74) *Attorney, Agent, or Firm* — Harness, Dickey & Pierce P.L.C.

(57) ABSTRACT

A semiconductor device and a data storage system including the same are provided. The semiconductor device including a plate layer, a pattern structure on the plate layer, an upper pattern layer on the pattern structure, an upper structure including a stack structure and a capping insulating structure covering at least a portion of the stack structure, the stack structure including interlayer insulating layers and gate layers alternately stacked on each other, and separation structures and vertical memory structures penetrating through the upper structure, the upper pattern layer, and the pattern structure, and extending into the plate layer may be provided.

20 Claims, 49 Drawing Sheets

(51) Int. Cl.
*H10B 43/27* (2023.01)
*H10B 43/35* (2023.01)

(56) References Cited

U.S. PATENT DOCUMENTS

| | | | |
|---|---|---|---|
| 10,347,654 | B1 | 7/2019 | Iwai et al. |
| 2014/0043916 | A1 | 2/2014 | Costa et al. |
| 2014/0362641 | A1 | 12/2014 | Dong et al. |
| 2015/0318301 | A1* | 11/2015 | Lee .................. H10B 43/10 257/324 |
| 2016/0126252 | A1 | 5/2016 | Tsuda et al. |
| 2016/0190155 | A1* | 6/2016 | Lee .................. H10B 43/27 438/667 |
| 2018/0374862 | A1 | 12/2018 | Lee et al. |
| 2019/0371809 | A1 | 12/2019 | Yun et al. |
| 2020/0091167 | A1* | 3/2020 | Lee .................. H10B 41/27 |
| 2021/0043640 | A1 | 2/2021 | Kawaguchi et al. |
| 2021/0057445 | A1* | 2/2021 | Kim .................. H01L 29/105 |
| 2021/0082941 | A1 | 3/2021 | Son et al. |
| 2021/0098483 | A1 | 4/2021 | Kang et al. |
| 2022/0045084 | A1* | 2/2022 | Chun .................. H10B 41/41 |
| 2022/0115397 | A1* | 4/2022 | Cho .................. H10B 43/30 |

FOREIGN PATENT DOCUMENTS

| | | |
|---|---|---|
| KR | 2015/0046121 A | 4/2015 |
| KR | 2016/0018466 A | 2/2016 |
| KR | 10-2018-0138380 A | 12/2018 |
| KR | 10-2019-0138513 A | 12/2019 |
| KR | 10-2021-0025032 A | 3/2021 |
| KR | 10-2021-0037053 A | 4/2021 |

\* cited by examiner

SEMICONDUCTOR DEVICE AND DATA STORAGE SYSTEM INCLUDING THE SAME

CROSS-REFERENCE TO RELATED APPLICATION(S)

This application claims benefit of priority to Korean Patent Application No. 10-2021-0075945 filed on Jun. 11, 2021 in the Korean Intellectual Property Office, the disclosure of which is incorporated herein by reference in its entirety.

BACKGROUND

The present inventive concepts relate to semiconductor devices and/or data storage systems including the same.

In an electronic system requiring data storage, a semiconductor device capable of storing high-capacity data may be required. Accordingly, methods for increasing data storage capacity of semiconductor devices are being studied. For example, as a method for increasing data storage capacity of a semiconductor device, a semiconductor device including memory cells arranged three-dimensionally, instead of memory cells arranged two-dimensionally, has been proposed.

SUMMARY

An aspect of the present inventive concepts is to provide semiconductor devices capable of improving a degree of integration.

An aspect of the present inventive concepts is to provide data storage systems including a semiconductor device capable of improving a degree of integration.

A semiconductor device according to an aspect of the present inventive concepts may include a plate layer, a pattern structure on the plate layer, an upper pattern layer on the pattern structure, an upper structure including a stack structure being on the upper pattern layer and including interlayer insulating layers and gate layers alternately stacked each other, a capping insulating structure covering at least a portion of the stack structure, separation structures penetrating through the upper structure, the upper pattern layer, and the pattern structure, and extending into the plate layer, and vertical memory structures penetrating through the upper structure, the upper pattern layer, and the pattern structure between the separation structures, extending into the plate layer, and contacting the plate layer, wherein each of the separation structures includes a lower portion disposed in the plate layer and including a first lower portion contacting the plate layer, a second lower portion penetrating through the pattern structure, and a third lower portion penetrating through the upper pattern layer, and an upper portion penetrating through the upper structure on the lower portion, and a maximum width of the first lower portion is different from a maximum width of the third lower portion.

A semiconductor device according to an aspect of the present inventive concepts includes a plate layer, an upper structure including a stack structure and a capping insulating structure, the stack structure on the plate layer and including interlayer insulating layers and gate layers alternately stacked on each other, the capping insulating structure covering at least a portion of the stack structure, separation structures penetrating through at least a portion of the upper structure, and vertical memory structures penetrating through the upper structure between the separation structures, wherein a first separation structure among the separation structures comprises a first line portion extending in a first direction, parallel to an upper surface of the plate layer, and a plurality of first pillar portions being on a different height level from the first line portion and spaced apart from each other in the first direction, and the plurality of first pillar portions are at a level lower than that of an uppermost gate layer among the gate layers, and at a level higher than that of a lowermost gate layer among the gate layers.

A data storage system according to an aspect of the present inventive concepts includes a semiconductor device including an input/output pad, and a controller electrically connected to the semiconductor device through the input/output pad and configured to control the semiconductor device, wherein the semiconductor device includes a plate layer, a pattern structure on the plate layer, an upper pattern layer on the pattern structure, an upper structure including a stack structure and a capping insulating structure covering at least a portion of the stack structure, the stack structure on the plate layer and including interlayer insulating layers and gate layers alternately stacked on each other, separation structures penetrating through the upper structure, the upper pattern layer, and the pattern structure, and extending into the plate layer, and vertical memory structures penetrating through the upper structure, the upper pattern layer, and the pattern structure between the separation structures, extending into the plate layer, and contacting the plate layer, wherein each of the separation structures includes a lower portion disposed in the plate layer and including a first lower portion contacting the plate layer, a second lower portion penetrating through the pattern structure, and a third lower portion penetrating through the upper pattern layer, and an upper portion penetrating through the upper structure on the lower portion, and a maximum width of the first lower portion is different from a maximum width of the third lower portion.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, terms such as "upper," "intermediate," and "lower" may be replaced with other terms, for example, "first," "second," and "third," to describe the elements of the specification. Terms such as "first," "second," and "third" may be used to describe various components, but the components are not limited by the terms. A "first component" may be called a "second component," or may be named as another term, distinguishable from other components.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
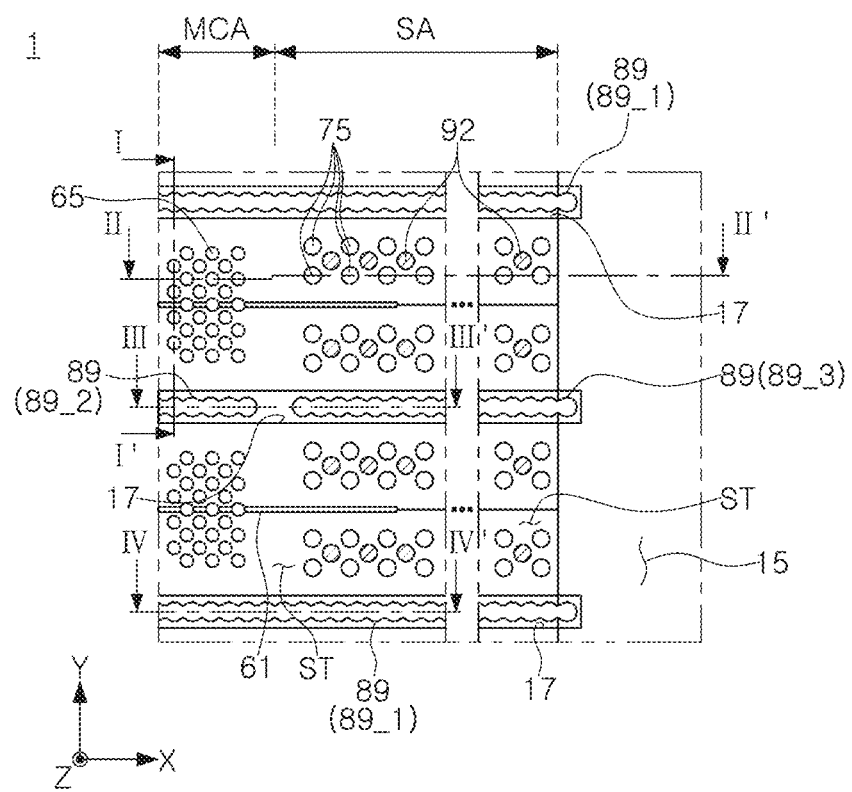
FIGS. 1, 2A, 2B, 3 and 4 are views illustrating a semiconductor device according to an example embodiment of the present inventive concepts.

First, a semiconductor device according to an example embodiment of the present inventive concepts will be described with reference to FIGS. 1, 2A, and 2B. FIG. 1 may be a plan view schematically illustrating a semiconductor device according to an example embodiment of the present inventive concepts, FIG. 2A may be a cross-sectional view schematically illustrating a region taken along line I-I' and a region taken along line II-II' of FIG. 1, and FIG. 2B may be a cross-sectional view schematically illustrating a region taken along line III-III' and a region taken along line IV-IV' of FIG. 1.

Figure 2A:
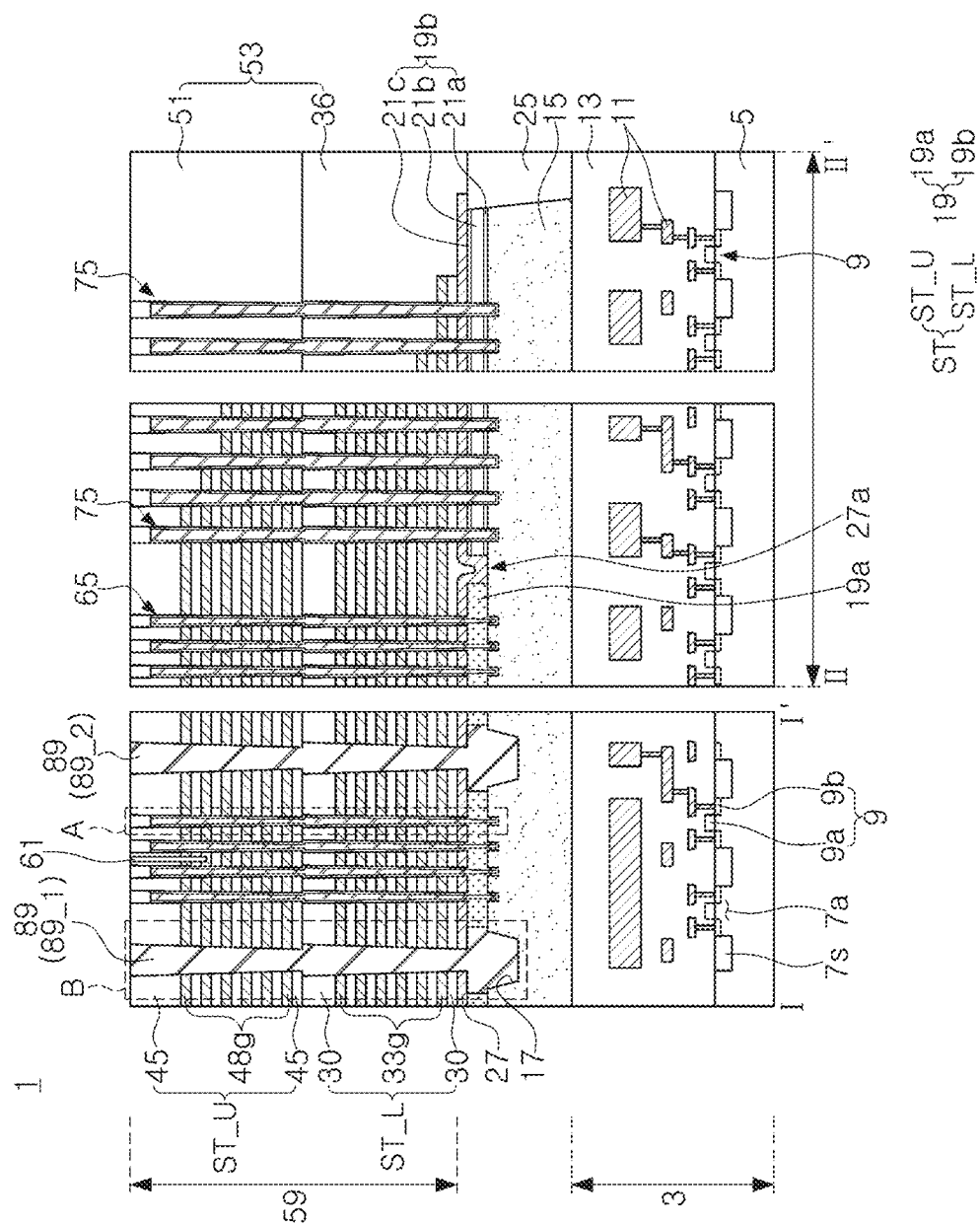
Figure 2B:
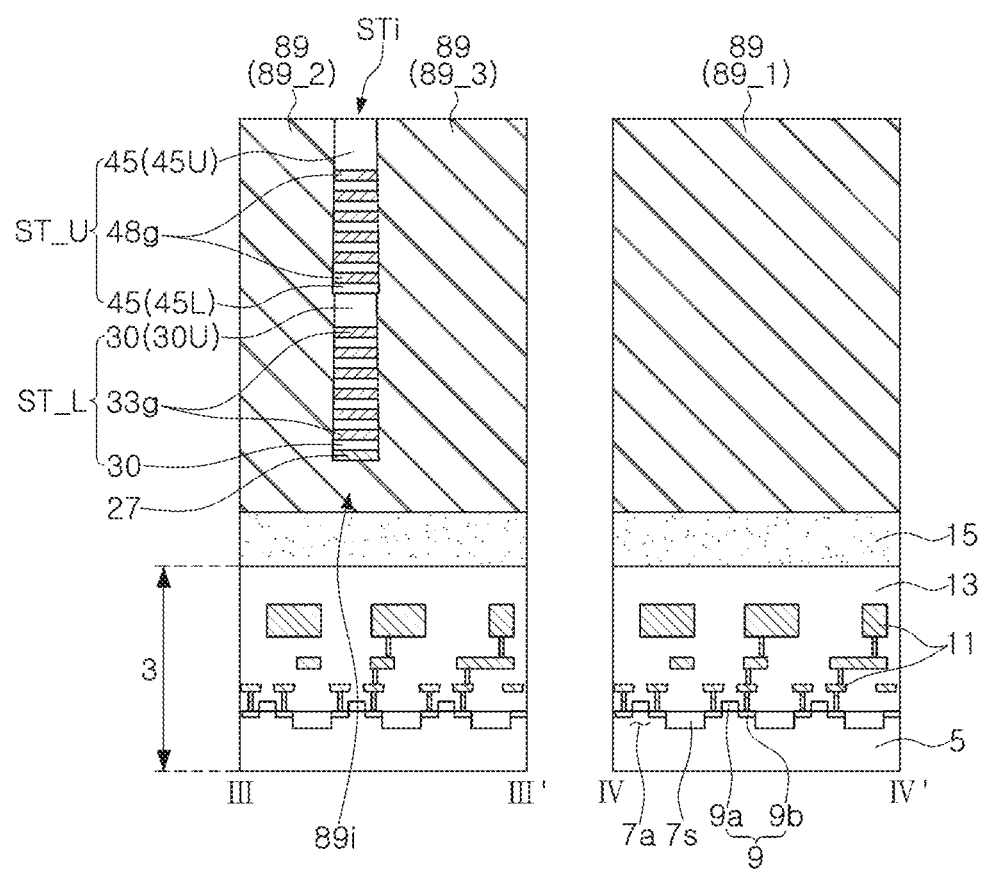

Referring to FIGS. 1, 2A, and 2B, a semiconductor device 1 according to an example embodiment may include a peripheral circuit structure 3, a plate layer 15, an upper structure 59, vertical memory structures 65, vertical support structures 75, and separation structures 89.

The peripheral circuit structure 3 may include a semiconductor substrate 5, an device isolation layer 7s defining an active region 7a in the semiconductor substrate 5, a peripheral circuit 9 on the semiconductor substrate 5, a circuit interconnection 11 electrically connected to the peripheral circuit 9 on the semiconductor substrate 5, and a lower insulating layer 13 covering the peripheral circuit 9 and the circuit interconnection 11 on the semiconductor substrate 5. The peripheral circuit 9 may include a peripheral gate 9a on the active region 7a, and a peripheral source/drain 9b disposed in the active region 7a on both sides of the peripheral gate 9a.

The plate layer 15 may be disposed on the peripheral circuit structure 3. The plate layer 15 may include a silicon layer, for example, a doped silicon layer. For example, the plate layer 15 may include a silicon layer having N-type conductivity.

The semiconductor device 1 may further include a pattern structure 19 on the plate layer, and an upper pattern layer 27 on the pattern structure 19. The upper pattern layer 27 may include a contact portion 27a penetrating through the pattern structure 19 and contacting the plate layer 15. The upper pattern layer 27 may include a silicon layer, for example, a doped silicon layer. For example, the upper pattern layer 27 may be formed of a silicon layer having N-type conductivity.

The pattern structure 19 may include a first pattern layer 19a and a second pattern layer 19b, separated by the contact portion 27a of the upper pattern layer 27. The first pattern layer 19a and the second pattern layer 19b may be disposed on the same height level.

The first pattern layer 19a may include a silicon layer, for example, a doped silicon layer. For example, the first pattern layer 19a may be formed of a silicon layer having N-type conductivity. The second pattern layer 19b may include at least two layers, for example, a first intermediate layer 21a, a second intermediate layer 21b, and a third intermediate layer 21c, sequentially stacked. The first and third intermediate layers 21a and 21c may be formed of silicon oxide, and the second intermediate layer 21b may be formed of silicon nitride.

The upper structure 59 may include a stack structure ST and a capping insulating structure 53.

The stack structure ST may include interlayer insulating layers 30 and 45 and gate layers 33g and 48g, alternately stacked on the upper pattern layer 27.

The interlayer insulating layers 30 and 45 may be lower interlayer insulating layers 30 spaced apart from each other in a vertical (Z) direction, perpendicular to an upper surface of the plate layer 15, and upper interlayer insulating layers 45 spaced apart from each other in the vertical (Z) direction on a level higher than that of the lower interlayer insulating layers 30.

The gate layers 33g and 48g include lower gate layers 33g spaced apart from each other in the vertical (Z) direction, and upper gate layers 48g spaced apart from each other in the vertical (Z) direction on a level higher than the lower gate layers 33g.

The lower interlayer insulating layers 30 and the lower gate layers 33g may be alternately and repeatedly stacked to form a lower stack structure ST_L. The upper interlayer insulating layers 45 and the upper gate layers 48g may be alternately and repeatedly stacked to form an upper stack structure ST_U. The stack structure ST may include the lower stack structure ST_L and the upper stack structure ST_U on the lower stack structure ST_L.

An uppermost layer among the lower interlayer insulating layers 30 and the lower gate layers 33g may be an uppermost lower interlayer insulating layer 30U.

Among the upper interlayer insulating layers 45 and the upper gate layers 48g, an uppermost layer may be an uppermost upper interlayer insulating layer 45U, and a lowermost layer may be a lowermost upper interlayer insulating layer 45L.

At least one side of the stack structure ST may have a stepped shape. For example, the stack structure ST may have a substantially flat upper surface in a first region MCA on the plate layer 15 and may have a stepped shape in a second region SA on the plate layer 15.

The first region MCA may be a memory cell array region, and the second region SA may be a stepped region or a gate contact region. Hereinafter, the first region MCA will be referred to as a 'memory cell array region' and the second region SA will be referred to as a 'stepped region.'

In the stepped region SA, the semiconductor device 1 may further include gate contact plugs 92 electrically connected to the gate layers 33g and 48g.

The capping insulating structure 53 may include a lower capping insulating layer 36 covering at least a portion of the lower stack structure ST_L having a stepped shape, and an upper capping insulating layer 51 covering at least a portion of the upper stack structure ST_U having a stepped shape on the lower capping insulating layer 36.

The separation structures 89 may penetrate through the upper structure 59, the upper pattern layer 27, and the pattern structure 19, and may extend into the plate layer 15.

The separation structures 89 may include first separation structures 89_1 parallel to each other, and a second separation structure 89_2 and a third separation structure 89_3 that are arranged between the first separation structures 89_1 and have opposite end portions, respectively. In other words, a second separation structure 89_2 and a third separation structure 893 may be provided in a row between the first separation structures 89_1.

The separation structures 89 may further include a connection portion 89i connecting a lower portion of the second separation structure 89_2 and a lower portion of the third separation structure 89_3.

The stack structure ST may further include a stacked connection portion STi disposed between the second separation structure 89_2 and the third separation structure 89_3 and disposed on the connection portion 89i.

A portion of the upper pattern layer 27 may be disposed between the stacked connection portion STi and the connection portion 89i.

The separation structures 89 may be formed of an insulating material such as silicon oxide, but example embodiments thereof are not limited thereto. For example, each of the separation structures 89 may include a conductive pattern and an insulating spacer covering a side surface of the conductive pattern.

The vertical memory structures 65 may be disposed in the memory cell array region MCA. The vertical memory structures 65 may penetrate through the upper structure 59, the upper pattern layer 27, and the first pattern layer 19a of the pattern structure 19 between the separation structures 89, and may extend into the plate layer 15 to contact the plate layer 15.

The vertical support structures 75 may be disposed in the stepped region SA. The vertical support structures 75 may penetrate through the upper structure 59, the upper pattern layer 27, and the first pattern layer 19a of the pattern structure 19 between the separation structures 89, and may extend into the plate layer 15 to contact the plate layer 15. The vertical support structures 75 may serve as supports for preventing defects such as deformation or collapse of the stack structure ST in the stepped region SA.

Figure 3:
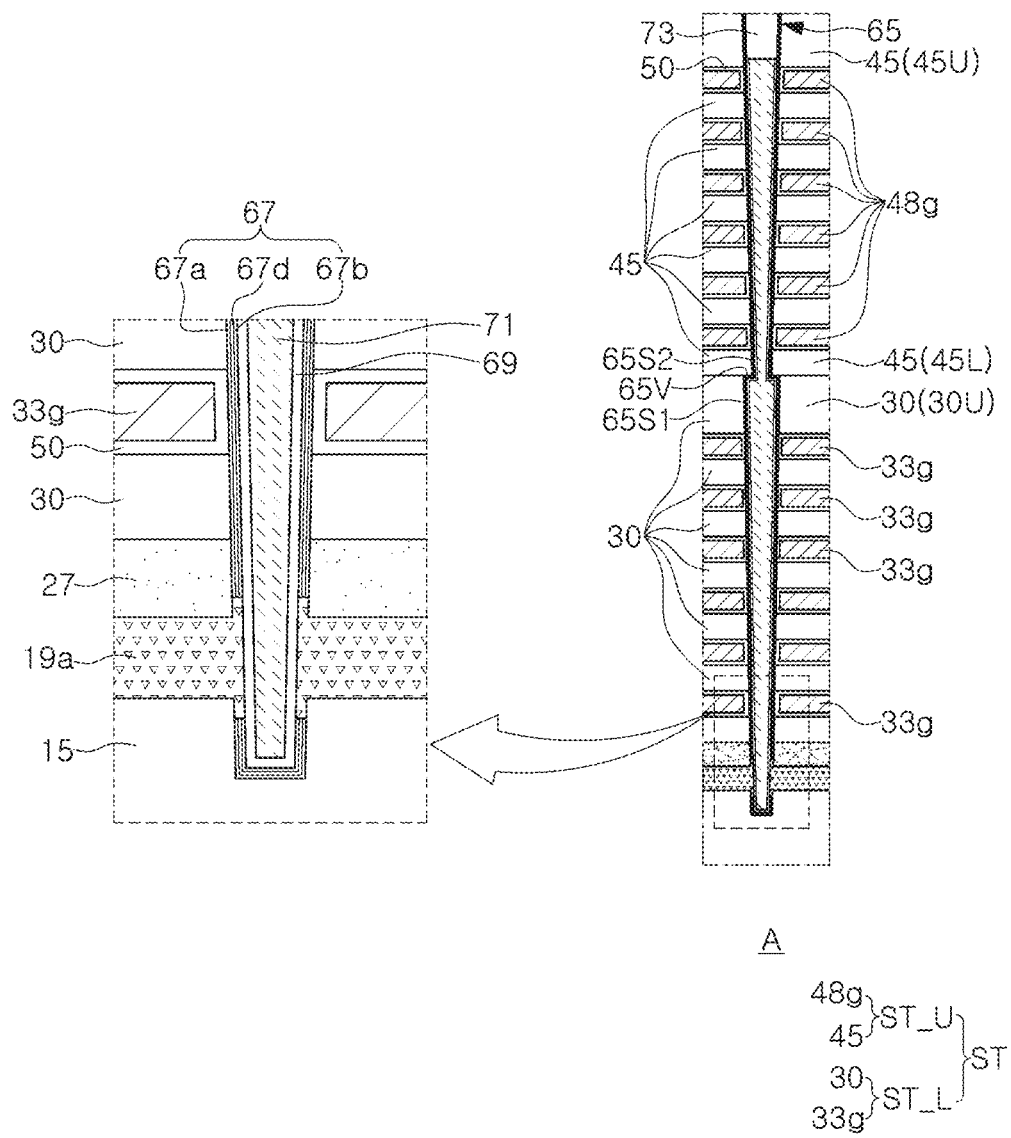

Next, a cross-sectional structure of any one of the vertical memory structures 65 and a cross-sectional structure of the stack structure ST will be described with reference to FIG. 3. FIG. 3 may be a partially enlarged view of portion 'A' of FIG. 2A.

Referring to FIG. 3 together with FIGS. 1 to 2B, the vertical memory structure 65 may include an insulating core pattern 71, a channel layer 69 covering side and bottom surfaces of the insulating core pattern 71, a pad pattern 73 disposed on the insulating core pattern 71 and contacting the channel layer 69, and a data storage structure 67 covering at least an outer side surface of the channel layer 69. The data storage structure 67 may include a first dielectric layer 67a, a second dielectric layer 67b, and a data storage layer 67d between the first and second dielectric layers 67a and 67b. The second dielectric layer 67b may be interposed between the data storage layer 67d and the channel layer 69.

The insulating core pattern 71 may include silicon oxide, for example, silicon oxide formed by an atomic layer deposition process, or silicon oxide having voids formed therein. The second dielectric layer 67b may include silicon oxide or silicon oxide doped with impurities. The first dielectric layer 67a may include at least one of silicon oxide and a high-k dielectric. The data storage layer 67d may include a material capable of storing information by trapping a charge, for example, silicon nitride. The data storage layer 67d may include regions capable of storing information in a semiconductor device such as a flash memory device. The channel layer 69 may include a silicon layer, for example, an undoped silicon layer. The pad pattern 73 may include at least one of doped polysilicon, a metal nitride (e.g., TiN), a metal (e.g., W), or a metal-semiconductor compound (e.g., TiSi).

The first pattern layer 19a may penetrate through the data storage structure 67, and may be in contact with the channel layer 69, and the data storage structure 67 may be separated as an upper portion and a lower portion by the first pattern layer 19a. The first pattern layer 19a contacting the channel layer 69 may be formed of a silicon layer having N-type conductivity.

On a height level between an uppermost lower gate layer of the lower gate layers 33g and a lowermost upper gate layer of the upper gate layers 48g, a side surface of the vertical memory structure 65 may include a side slope change portion 65V.

In the side surface of the vertical memory structure 65, the side slope change portion 65V may refer to a portion in which a slope changes between an adjacent upper side surface 65S2 and an adjacent lower side surface 65S1. For example, in the side surface of the vertical memory structure 65, the side slope change portion 65V may refer to a portion of a side surface having a gentle slope between the upper side surface 65S2 having a steep slope and the lower side surface 65S1 having a steep slope.

The lower and upper gate layers 33g and 48g may include at least one of doped polysilicon, a metal-semiconductor compound (e.g., TiSi, TaSi, CoSi, NiSi, or WSi), metal nitride (e.g., TiN, TaN, or WN), or a metal (e.g., Ti or W).

The stack structure ST may further include a dielectric layer 50 covering upper and lower surfaces of each of the lower and upper gate layers 33g and 48g, and extending between each of the lower and upper gate layers 33g and 48g and the vertical memory structure 65. The dielectric layer 50 may include a high-k dielectric such as AlO or the like.

In an example, the vertical memory structure 65 and the vertical support structure 75 in FIGS. 1 and 2A may be simultaneously formed, and may include layers of the same material. For example, the vertical support structure 75 may include layers corresponding to the data storage structure 67, the channel layer 69, and the pad pattern 73 of the vertical memory structure 65, respectively.

Figure 4:
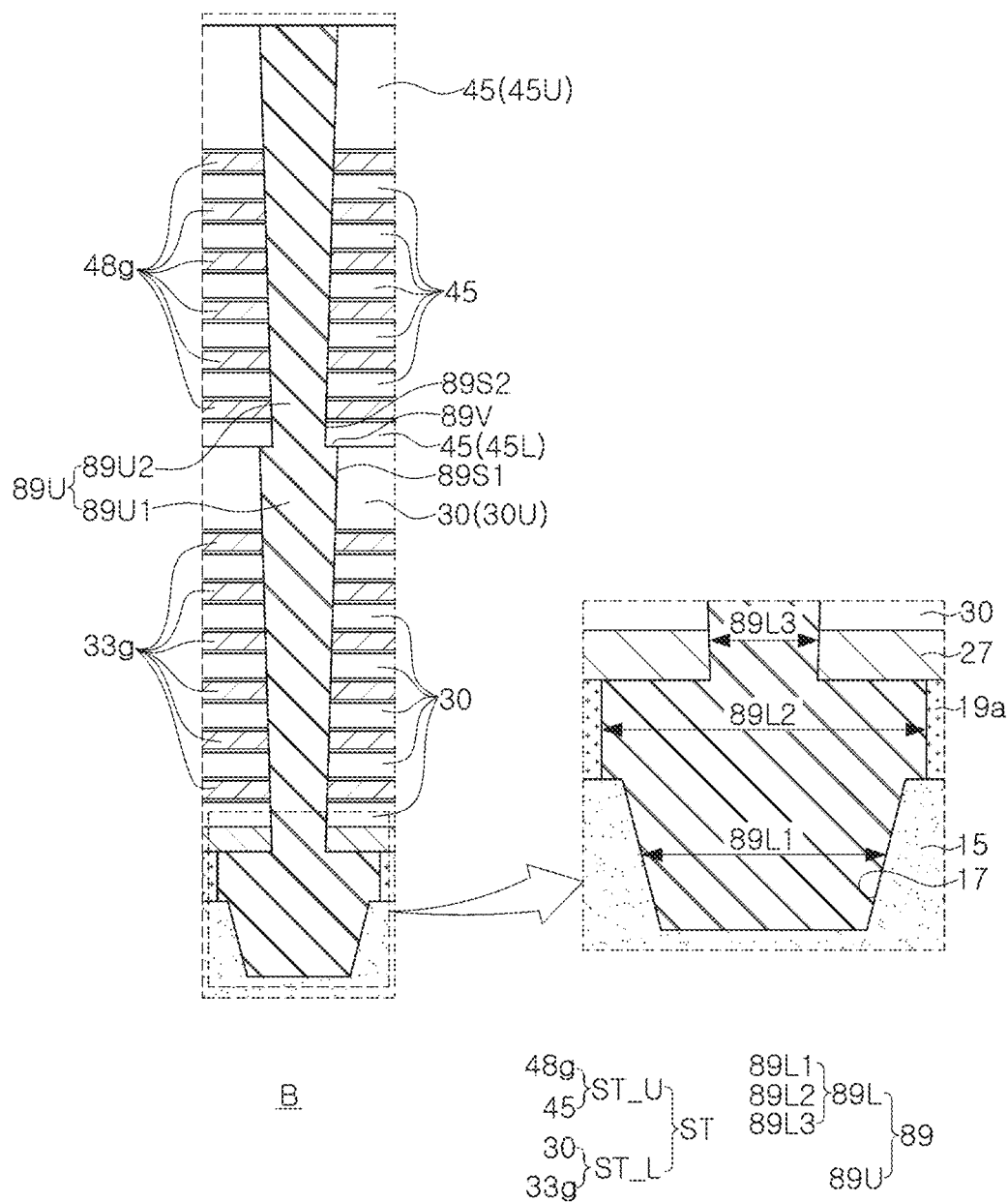

Next, a cross-sectional structure of any one of the separation structures 89 will be described with reference to FIG. 4. FIG. 4 may be a partially enlarged view of portion 'B' of FIG. 2A.

Referring to FIG. 4 together with FIGS. 1 to 3, each of the separation structures 89 may include a lower portion 89_L and an upper portion 89_U on the lower portion 89_L.

The lower portion 89_L may be disposed in a trench 17 of the plate layer 15, and may include a first lower portion 89_L1 contacting the plate layer 15, a second lower portion 89_L2 penetrating through the pattern structure 19, and a third lower portion 89_L3 penetrating through the upper pattern layer 27. The upper portion 89_U may be disposed on the lower portion 89_L, and may penetrate through the upper structure 59. The upper portion 89_U may include a first upper portion 89_U1 at least penetrating through the first stack structure ST_L, and a second upper portion 89_U2 disposed on the first upper portion 89_U1 and at least penetrating through the second stack structure ST_U.

A maximum width of the first lower portion 89_L1 may be different from a maximum width of the third lower portion 89_L3. For example, a maximum width of the first lower portion 89_L1 may be wider than a maximum width of the third lower portion 89_L3.

A maximum width of the second lower portion 89_L2 may be different from a maximum width of the third lower portion 89_L3. For example, a maximum width of the second lower portion 89_L2 may be wider than a maximum width of the third lower portion 89_L3.

A maximum width of the second lower portion 89_L2 may be different from a maximum width of the first lower portion 89_L1. For example, a maximum width of the second lower portion 89_L2 may be wider than a maximum width of the first lower portion 89_L1.

A width of the upper portion 89_U adjacent to the lower portion 89_L may be narrower than a width of the first lower portion 89_L1.

A width of the upper portion 89_U adjacent to the lower portion 89_L may be narrower than a width of the second lower portion 89_L2.

A width of the upper portion 89_U adjacent to the lower portion 89_L may be the same as or substantially similar to a width of the third lower portion 89_L3.

In each of the separation structures 89, a side surface 89S of the upper portion 89_U may include a slope change portion 89V in which a side slope changes, on a height level between an uppermost lower gate layer of the lower gate layers 33g and a lowermost upper gate layer of the upper gate layers 48g. For example, in each of the separation structures 89, the side surface 89S of the upper portion 89_U may include a first side surface 89S1 of the first upper portion 89_U1, a second side surface 89S2 of the second upper portion 89_U2, and a slope change portion 89V having a slope, different from a slope of the first side surface 89S1 and a slope of the second side surface 89S2.

When viewed in plan view, in each of the separation structures 89, a side shape of the first lower portion 89_L1 may be different from a side shape of the upper portion 89_U. For example, in plan view, a side surface of the first lower portion 89_L1 may have a straight linear shape, and a side surface of the upper portion 89_U may have a wavy shape. Because a sidewall of the first lower portion 89_L1 may be the same as or substantially similar to a sidewall of the trench 17, the sidewall of the trench 17 may have a straight linear shape, in plan view.

When viewed in plan view, in each of the separation structures 89, a side surface of the third lower portion 89_L3 may have a wavy shape.

When viewed in plan view, in each of the separation structures 89, a side surface of the second lower portion 89_L2 may have a wavy shape.

Hereinafter, various modifications of a semiconductor device 1 according to an example embodiment of the present inventive concepts will be described. Hereinafter, in describing various modified examples of the above-described semiconductor device 1, the above-described components of the semiconductor device 1 that may be modified or replaced will be mainly described, and descriptions of the substantially same components as the above-described components, components that may be easily understood from the above-described components, or components that may be easily understood from the drawings described above will be omitted.

Figure 5:
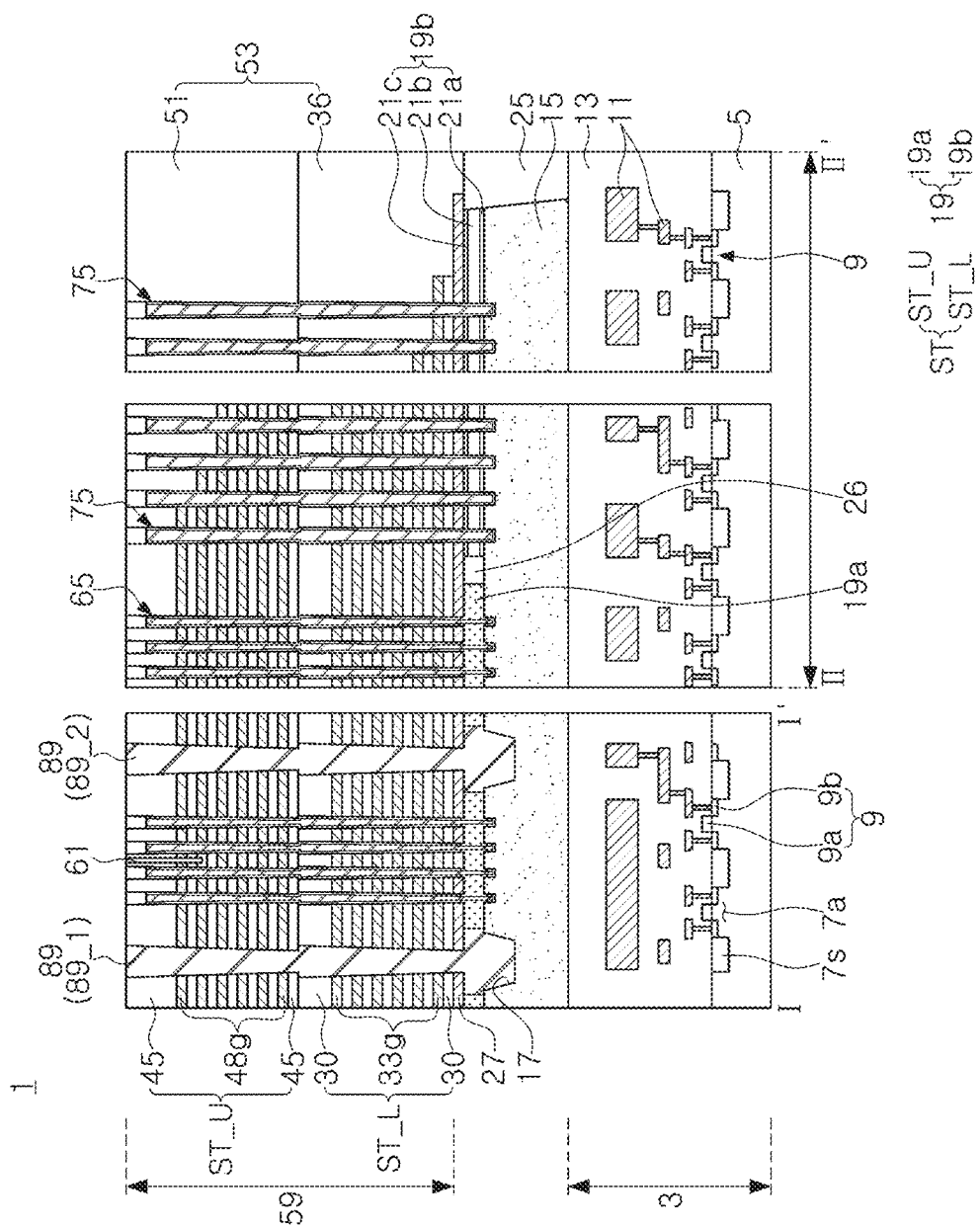
FIG. 5 is a cross-sectional view illustrating a modified example of a semiconductor device according to an example embodiment of the present inventive concepts.

First, a modified example of a semiconductor device according to an example embodiment of the present inventive concepts will be described with reference to FIG. 5. FIG. 5 may be a cross-sectional view schematically illustrating a region taken along line I-I' and a region taken along line II-II' of FIG. 1, to illustrate a modified example of a semiconductor device according to an example embodiment of the present inventive concepts.

Referring to FIG. 5, a buffer pattern layer 26 may be disposed between a first pattern layer 19a and a second pattern layer 19b of a pattern structure 19 that are spaced apart from each other. The buffer pattern layer 26 may be formed as a silicon layer. Therefore, the first pattern layer 19a and the second pattern layer 19b of the pattern structure 19 may be separated by the buffer pattern layer 26. An upper pattern layer 27 may cover the pattern structure 19 and the buffer pattern layer 26.

Figure 6:
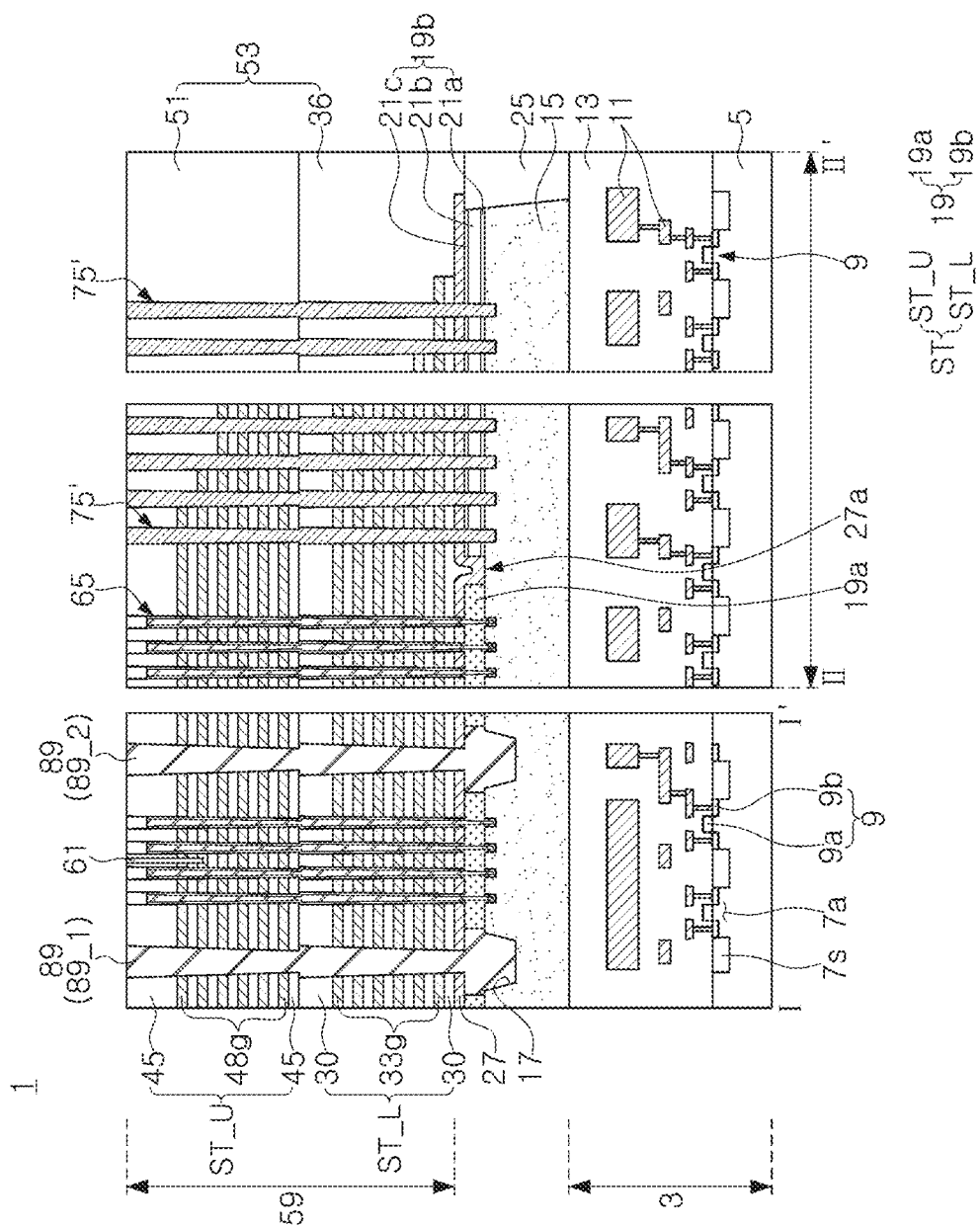
FIG. 6 is a cross-sectional view illustrating a modified example of a semiconductor device according to an example embodiment of the present inventive concepts.

Next, a modified example of a semiconductor device according to an example embodiment of the present inventive concepts will be described with reference to FIG. 6. FIG. 6 may be a cross-sectional view schematically illustrating a region taken along line I-I' and a region taken along line II-II' of FIG. 1, to illustrate a modified example of a semiconductor device according to an example embodiment of the present inventive concepts.

Referring to FIG. 6, a vertical support structure 75' in the modified example may include a material, different from that of a vertical memory structure 65. For example, the vertical support structure 75' may be formed of an insulating material such as silicon oxide, and may not include a data storage structure (67 of FIG. 3), a channel layer (69 of FIG. 3), and a pad pattern (73 of FIG. 3) of a vertical memory structure (65 of FIG. 3).

Figure 7:
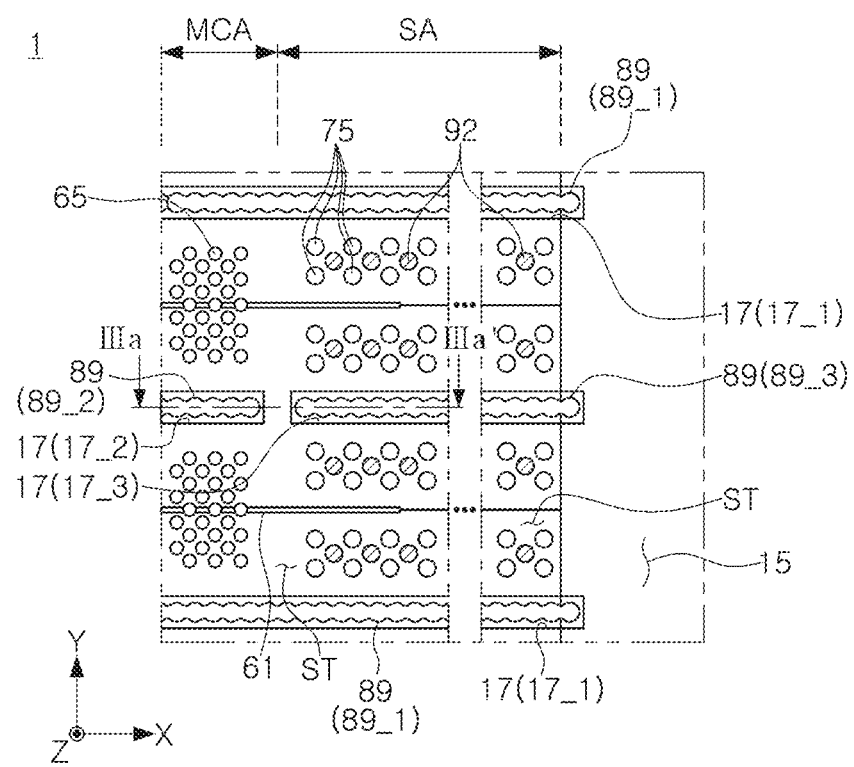
FIGS. 7 and 8 are views illustrating a modified example of a semiconductor device according to an example embodiment of the present inventive concepts.

Next, a modified example of a semiconductor device according to an example embodiment of the present inventive concepts will be described with reference to FIGS. 7 and 8. FIG. 7 may be a plan view illustrating a modified example of the trench 17 of FIG. 1, and FIG. 8 may be a cross-sectional view schematically illustrating a region taken along line IIIa-IIIa' of FIG. 7, to illustrate a modified example of a semiconductor device according to an example embodiment of the present inventive concepts.

Figure 8:
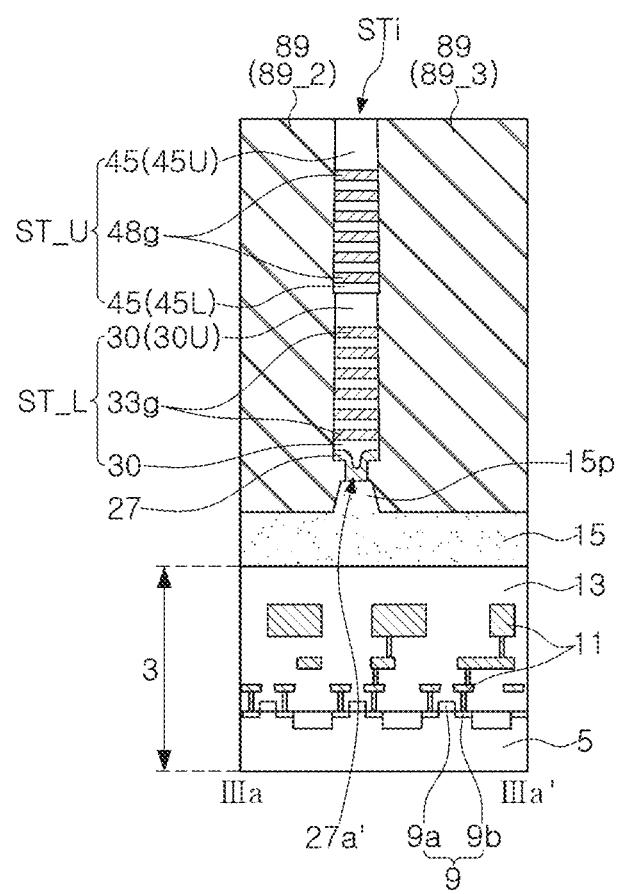

Referring to FIGS. 7 and 8, in the modified example, a trench 17 may include first trenches 171 overlapping first separation structures 891, a second trench 17_2 overlapping a second separation structures 89_2, and a third trench 17_3 overlapping a third separation structure 89_3.

The second trench 17_2 and the third trench 17_3 may be spaced apart from each other. A plate layer 15 may include a portion 15p separating the second trench 17_2 and the third trench 17_3. The second trench 17_2 and the third trench 17_3 may be spaced apart from each other.

The connection portion 89i of FIG. 2B, described above, may be omitted, and a second separation structure 89_2 and a third separation structure 89_3 may be spaced apart from each other.

An upper pattern layer 27 may include a portion 27a' contacting the portion 15p of the plate layer 15 separating the second trench 17_2 and the third trench 17_3 from each other.

The second separation structure 89_2 and the third separation structure 89_3 may be separated from each other by the portion 15p of the plate layer 15, the portion 27a' of the upper pattern layer 27, and a stacked connection portion STi, as described in FIG. 2B.

Next, a modified example of a semiconductor device according to an example embodiment of the present inventive concepts will be described with reference to FIGS. 9A to 9E, 10A, 10B, and 11. In FIGS. 9A to 11, FIGS. 9A to 9E may be plan views schematically illustrating a planar shape according to a height level in a modified example of a semiconductor device according to an example embodiment of the present inventive concepts, FIG. 10A may be a cross-sectional view schematically illustrating a region taken along line Ib-Ib' and a region taken along line IIb-IIb' in FIGS. 9A to 9E, FIG. 10B may be a cross-sectional view schematically illustrating a region taken along line IIIb-IIIb' and a region taken along line IVb-IVb' in FIGS. 9A to 9E, and FIG. 11 may be a partial enlarged view schematically illustrating portion 'Ba' of FIG. 10A.

Referring to FIGS. 9A to 9E, 10A, 10B, and 11, a semiconductor device 1a in the modified example may include a peripheral circuit structure 3, a plate layer 15, a pattern structure 19, an upper pattern layer 27, an upper structure 59, vertical memory structures 65, and vertical support structures 75, to be substantially identical to those described above.

The semiconductor device 1a may include separation structures 189 that may replace the separation structures 89 described above.

The separation structures 189 may include first separation structures 1891 parallel to each other, and a second separation structure 189_2 and a third separation structure 1893, arranged between the first separation structures 189_1 and having opposite end portions, respectively. In other words, the second separation structure 189_2 and the third separation structure 1893 may be provided in a row between the first separation structures 189_1.

The separation structures 189 may further include a connection portion 189i connecting a lower portion of the second separation structure 189_2 and a lower portion of the third separation structure 189_3. The connection portion 189i may be the same as or substantially similar to the connection portion 89i described with reference to FIG. 2B.

Each of the separation structures 189 may include a lower portion 189L and an upper portion 189U on the lower portion 189L.

In each of the separation structures 189, the lower portion 189L may include a first lower portion 189L1 disposed in a trench 17 of the plate layer 15 and contacting the plate layer 15, a second lower portion 189L2 penetrating through the pattern structure 19, and a plurality of third lower portions 189L3 penetrating through the upper pattern layer 27. The upper portion 189U may be disposed on the lower portion 189L, and may penetrate through the upper structure 59.

Each of the first and second lower portions 189L1 and 189L2 may have a linear shape extending in a first (X) direction.

The plurality of third lower portions 189L3 may have pillar shapes extending in the vertical (Z) direction from the line-shaped second lower portion 189L2 and spaced apart from each other in the first (X) direction. The plurality of third lower portions 189L3 may be referred to as pillar portions. The second lower portion 189L2 may be referred to as a line portion.

The upper portion 189U may include a first upper portion 189U1 at least penetrating through a lower stack structure ST_L, and a second upper portion 189U2 at least penetrating through an upper stack structure ST_U.

The first upper portion 189U1 may include a plurality of first portions 189U1_1 having pillar shapes and spaced apart from each other in the first (X) direction, a second portion 189U1_2 disposed on the plurality of first portions 189U1_1 and having a linear shape extending in the first (X) direction, and third portions 189U1_3 disposed on the second portion 189U1_2, having a pillar shape, and spaced apart from each other in the first (X) direction.

The plurality of first portions 189U1_1 may be referred to as pillar portions, and the third portions 189U1_3 may be referred to as pillar portions. The second portion 189U1_2 may be referred to as a line portion.

The plurality of first portions, that is the first pillar portions 189U1_3 may be disposed on a lever lower than an uppermost gate layer among gate layers 33g and 48g and on a level higher than that of a lowermost gate layer among gate layers 33g and 48g.

The plurality of first portions 189U1_1 may penetrate through a portion of a lowermost lower interlayer insulating layer 30L among lower interlayer insulating layers 30.

The second portion 189U1_2 may cover the plurality of first portions 189U1_1, and may extend to penetrate through a portion of the lowermost lower interlayer insulating layer 30L while penetrating through a portion of an uppermost lower interlayer insulating layer 30U.

Therefore, the second portion 189U1_2 may penetrate through lower gate layers 33g and the lower interlayer insulating layers 30 between the lower gate layers 33g. The third portions 189U1_3 may penetrate through a remaining portion of the uppermost lower interlayer insulating layer 30U.

The second upper portion 189U2 may include a plurality of fourth portions 189U2_1 overlapping the third portions 189U1_3, having a pillar shape, and spaced apart from each other in the first (X) direction, a fifth portion 189U2_2 disposed on the plurality of fourth portions 189U2_1 and having a linear shape extending in the first (X) direction on the portions, and sixth portions 189U2_3 disposed on the fifth portion 189U2_2, having a pillar shape, and spaced apart from each other in the first (X) direction.

The plurality of fourth portions 189U2_1 may be referred to as pillar portions. The fifth portion 189U2_2 may be referred to as a line portion. The sixth portions 189U2_3 may be referred to as pillar portions.

The plurality of fourth portions 189U2_1 may penetrate through a portion of a lowermost upper interlayer insulating layer 45L. The fifth portion 189U2_2 may cover the plurality of fourth portions 189U2_1, and may extend to penetrate through a portion of the lowermost upper interlayer insulating layer 45L while penetrating through a portion of an uppermost upper interlayer insulating layer 45U. Therefore, the fifth portion 189U2_2 may penetrate through upper gate layers 48g and upper interlayer insulating layers 45 between the upper gate layers 48g. The sixth portions 189U2_3 may penetrate through a remaining portion of the uppermost upper interlayer insulating layer 45U.

On the same height level as the plurality of third portions 189U1_3, the uppermost lower interlayer insulating layer 30U may be connected as a single layer without being separated by the separation structures 189. On the same height level as the plurality of fourth portions 189U2_1, the lowermost upper interlayer insulating layer 45L may be connected as a single layer without being separated by the separation structures 189. On the same height level as the sixth portions 189U2_3, the uppermost upper interlayer insulating layer 45U may be connected as a single layer without being separated by the separation structures 189.

The uppermost lower interlayer insulating layer 30U and the lowermost upper interlayer insulating layer 45L, located on the same height level as the plurality of third portions 189U1_3 and the plurality of fourth portions 189U2_1, and overlapping the second portion 189U1_2 and the fifth portion 189U2_2 having a linear shape extending in the first (X) direction, may be defined as an intermediate support structure SP1. Therefore, at least a portion of the intermediate support structure SP1 may be disposed on the same level as at least a portion of any one interlayer insulating layer among the interlayer insulating layers.

The uppermost upper interlayer insulating layer 45U located on the same height level as the sixth portions 189U2_3 and overlapping the second portion 189U1_2 and the fifth portion 189U2_2, extending in the first (X) direction, may be defined as an upper support structure SP2.

In some example embodiments, the intermediate and upper support structures SP1 and SP2 may serve to mitigate or prevent a stack structure ST from being collapsed or deformed. Therefore, reliability, durability, or productivity of the semiconductor device 1a may be improved.

Figure 9A:
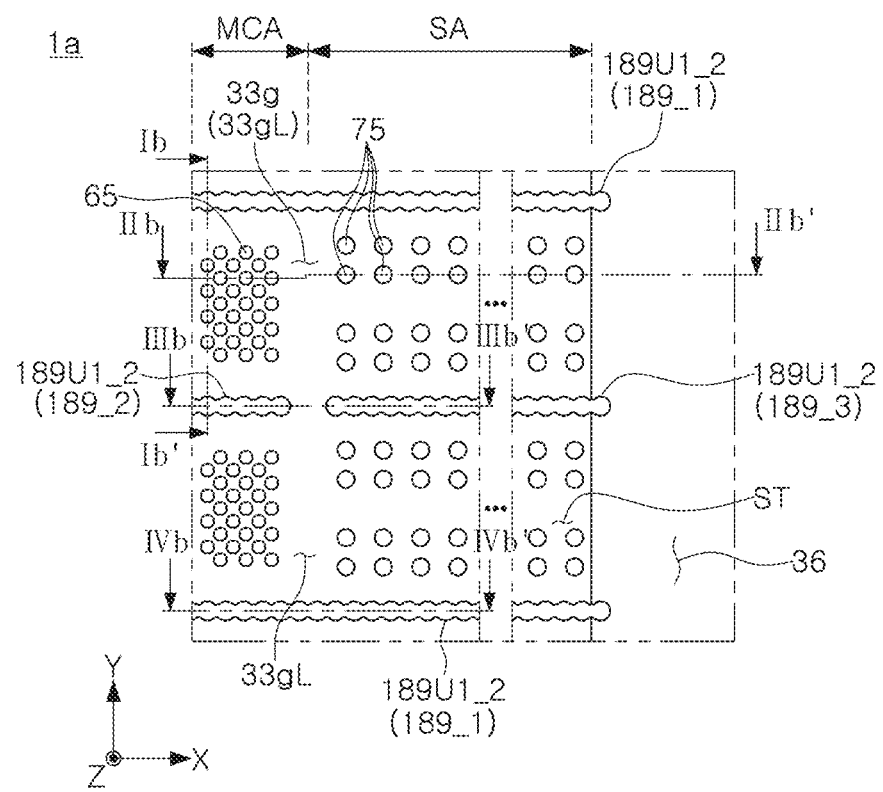
FIGS. 9A, 9B, 9C, 9D, 9E, 10A, 10B, and 11 are views illustrating a modified example of a semiconductor device according to an example embodiment of the present inventive concepts.
Figure 9B:
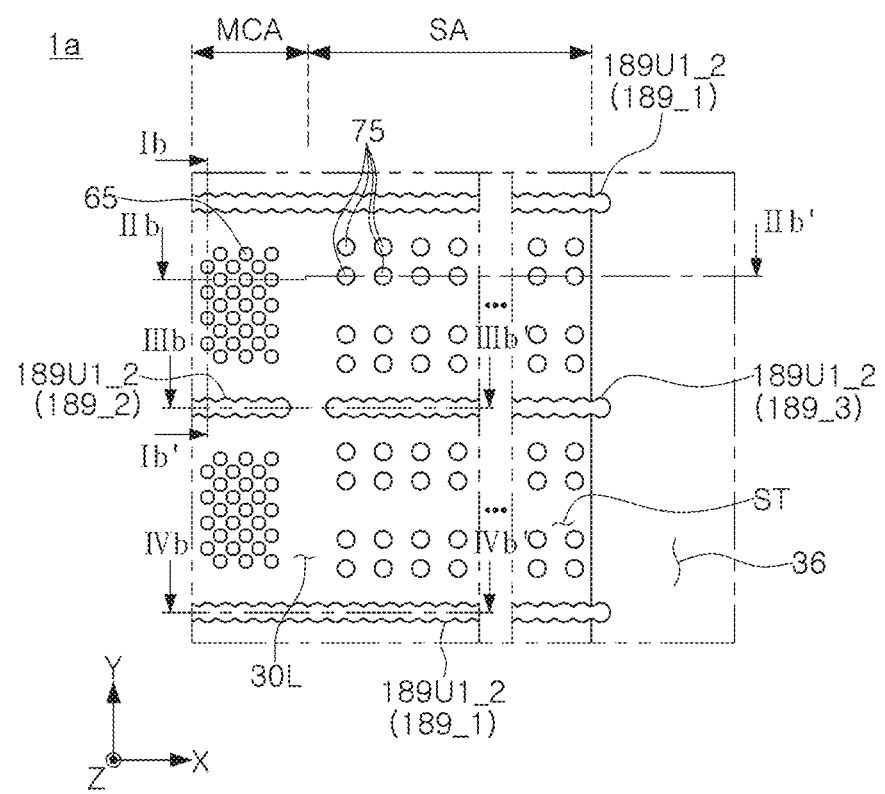
Figure 9C:
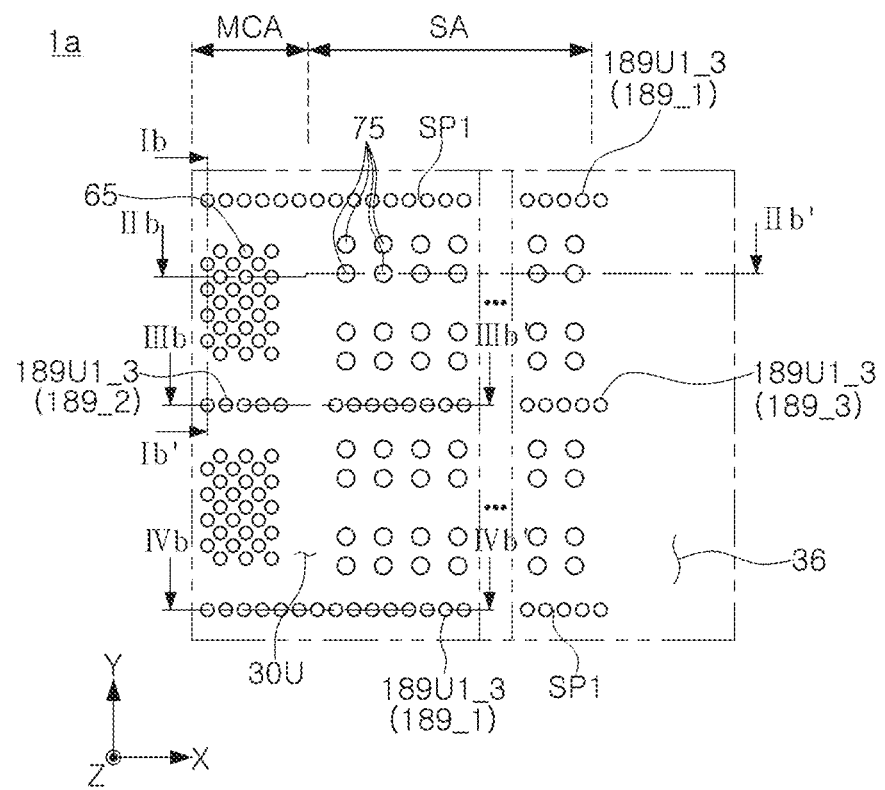
Figure 9D:
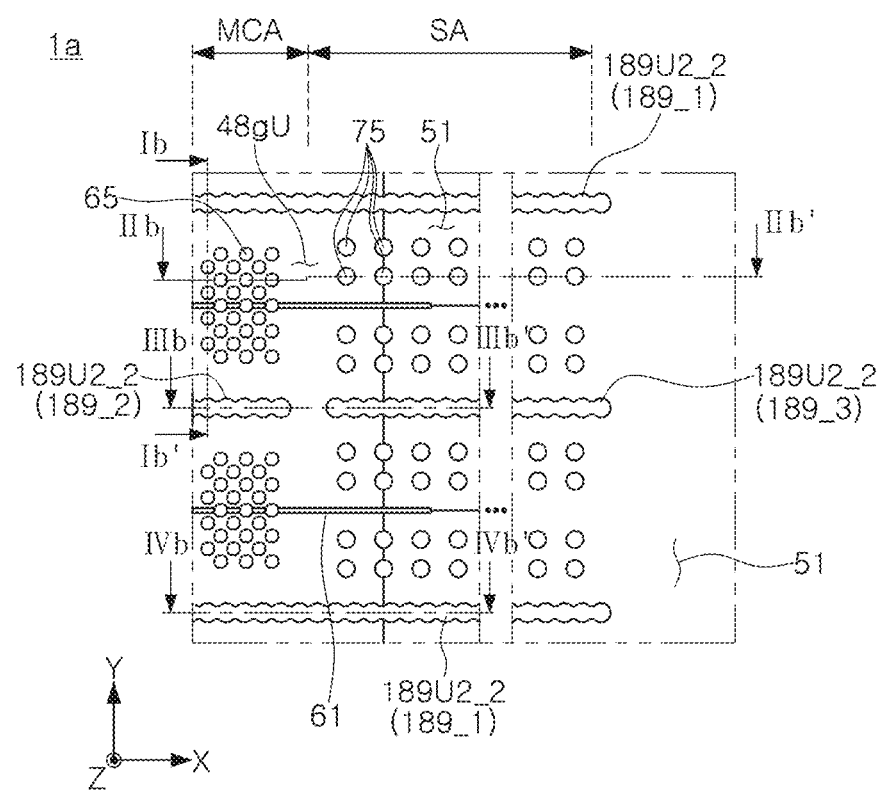
Figure 9E:
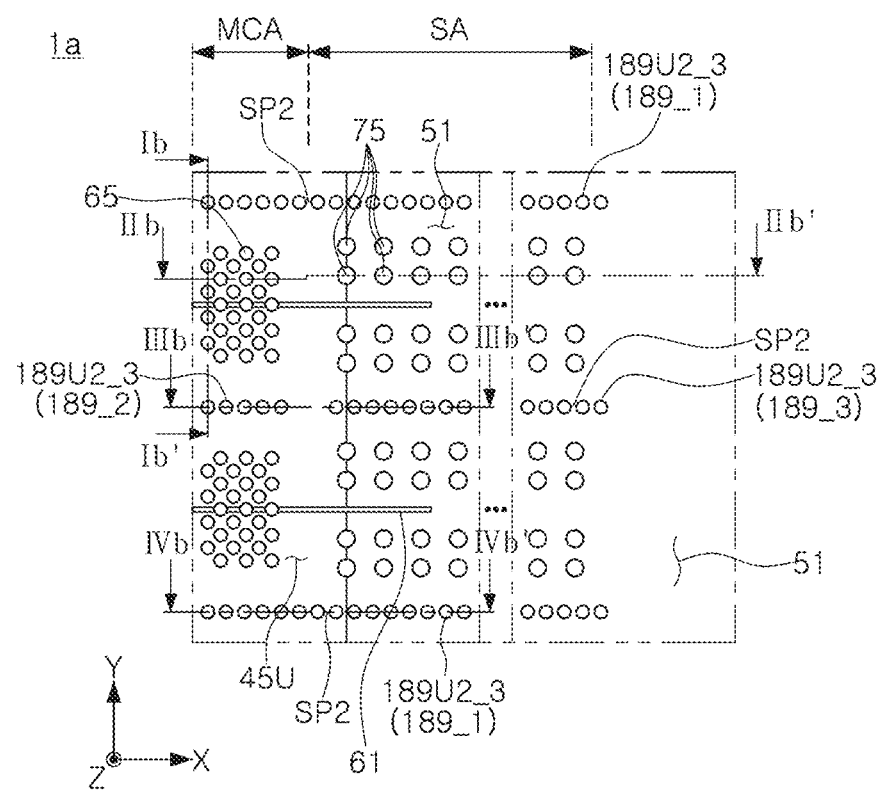

Referring to FIGS. 9A to 9E, FIG. 9A may be a plan view on a height level on which a lowermost lower gate layer 33gL among the lower gate layers 33g is located, FIG. 9B may be a plan view on a height level on which a lowermost lower interlayer insulating layer 30L adjacent to the lowermost lower gate layer 33gL is located, FIG. 9C may be a plan view on a height level on which an uppermost lower interlayer insulating layer 30U and a lower support structure SP1 are located, FIG. 9D may be a plan view on a height level on which an uppermost upper gate layer 48gU is located, and FIG. 9E may be a plan view on a height level on which an uppermost upper interlayer insulating layer 45U and an upper support structure SP2 are located.

Referring to FIGS. 9A to 9E, the second portion 189U1_2 and the fifth portion 189U2_2 having a linear shape extending in the first (X) direction may have a side surface of a wave pattern, and portions of the separation structures 189 located on the same height level as the intermediate and upper support structures SP1 and SP2, for example, each of the plurality of third portions 189U1_3 and the sixth portions 189U2_3 may have a circular shape.

Figure 12A:
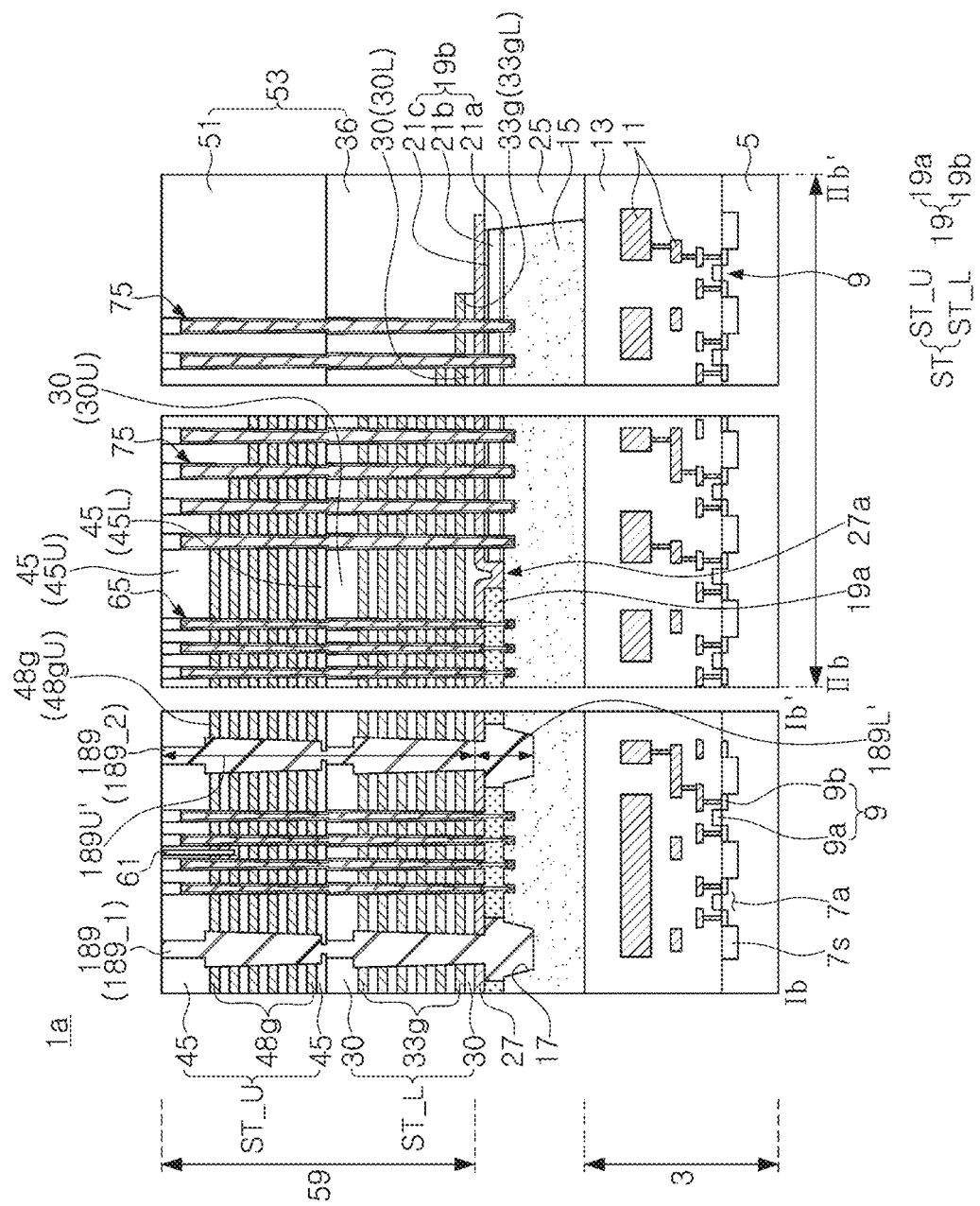
FIGS. 12A and 12B are views illustrating a modified example of a semiconductor device according to an example embodiment of the present inventive concepts.

Next, a modified example of a semiconductor device according to an example embodiment of the present inventive concepts will be described with reference to FIGS. 12A and 12B. FIG. 12A may be a cross-sectional view schematically illustrating a region taken along line Ib-Ib' and a region taken along line IIb-IIb' in FIGS. 9A to 9E, and FIG. 12B may be a cross-sectional view schematically illustrating a region taken along line IIIb-IIIb' and a region taken along line IVb-IVb' in FIGS. 9A to 9E.

Figure 10A:
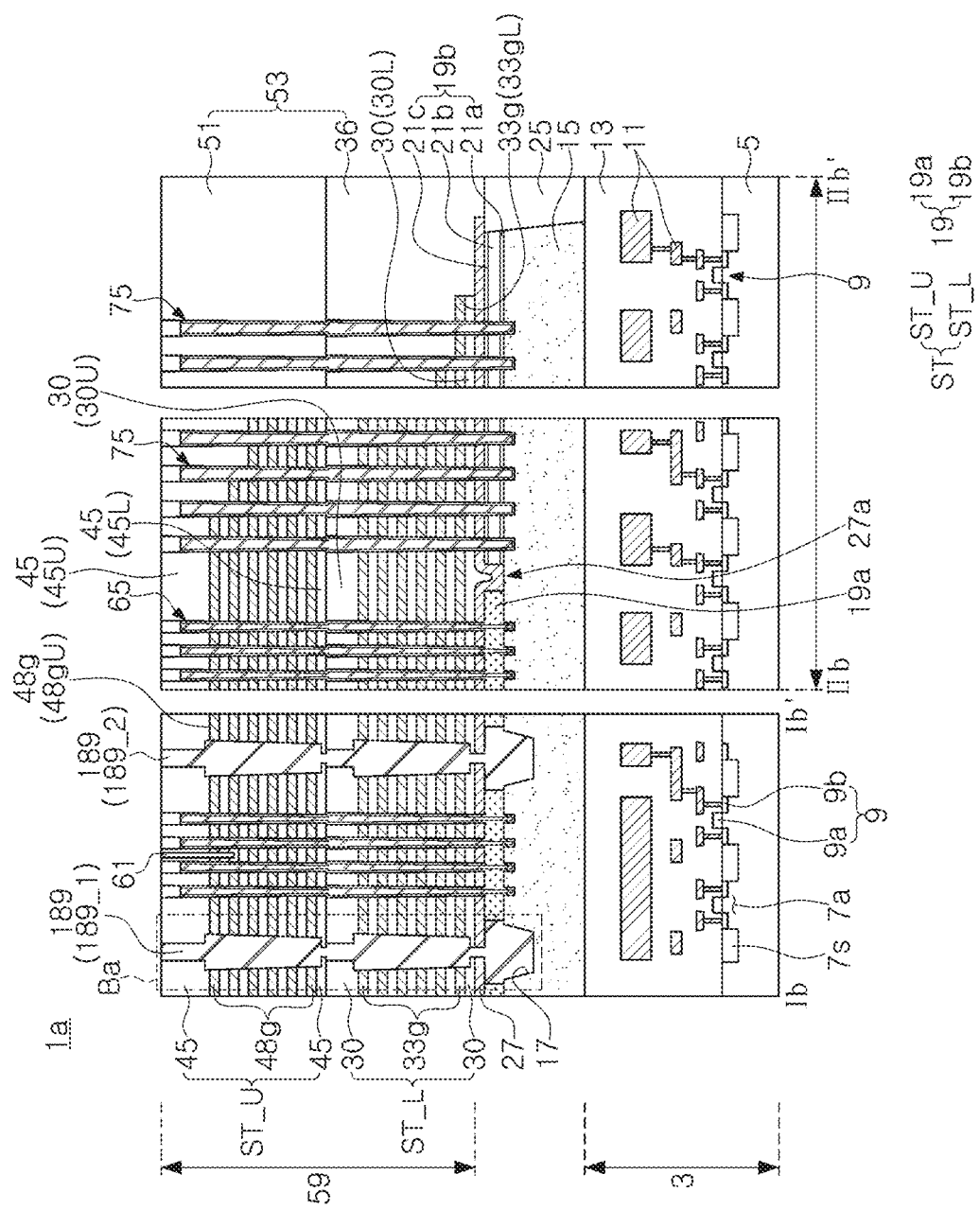
Figure 10B:
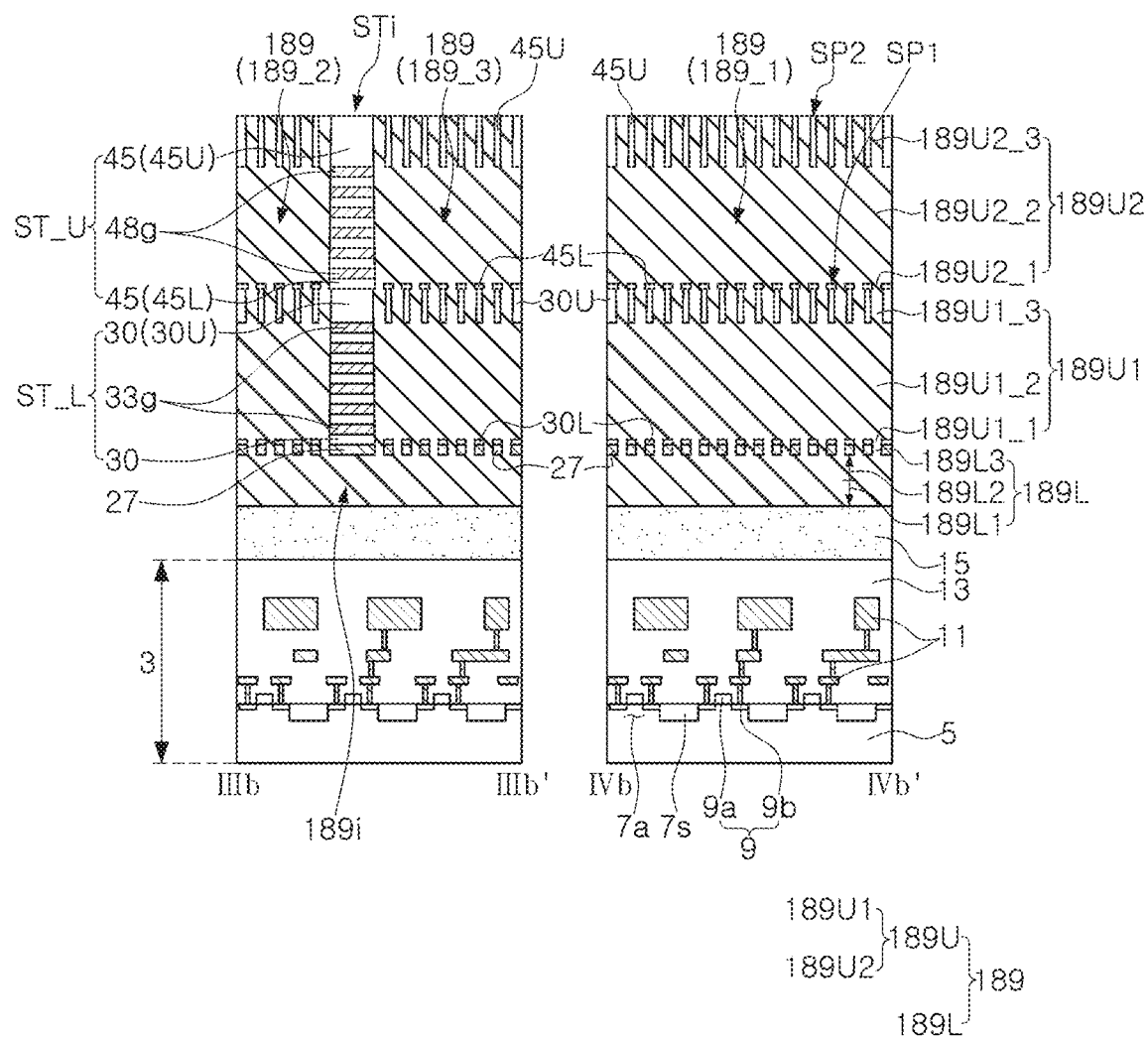
Figure 11:
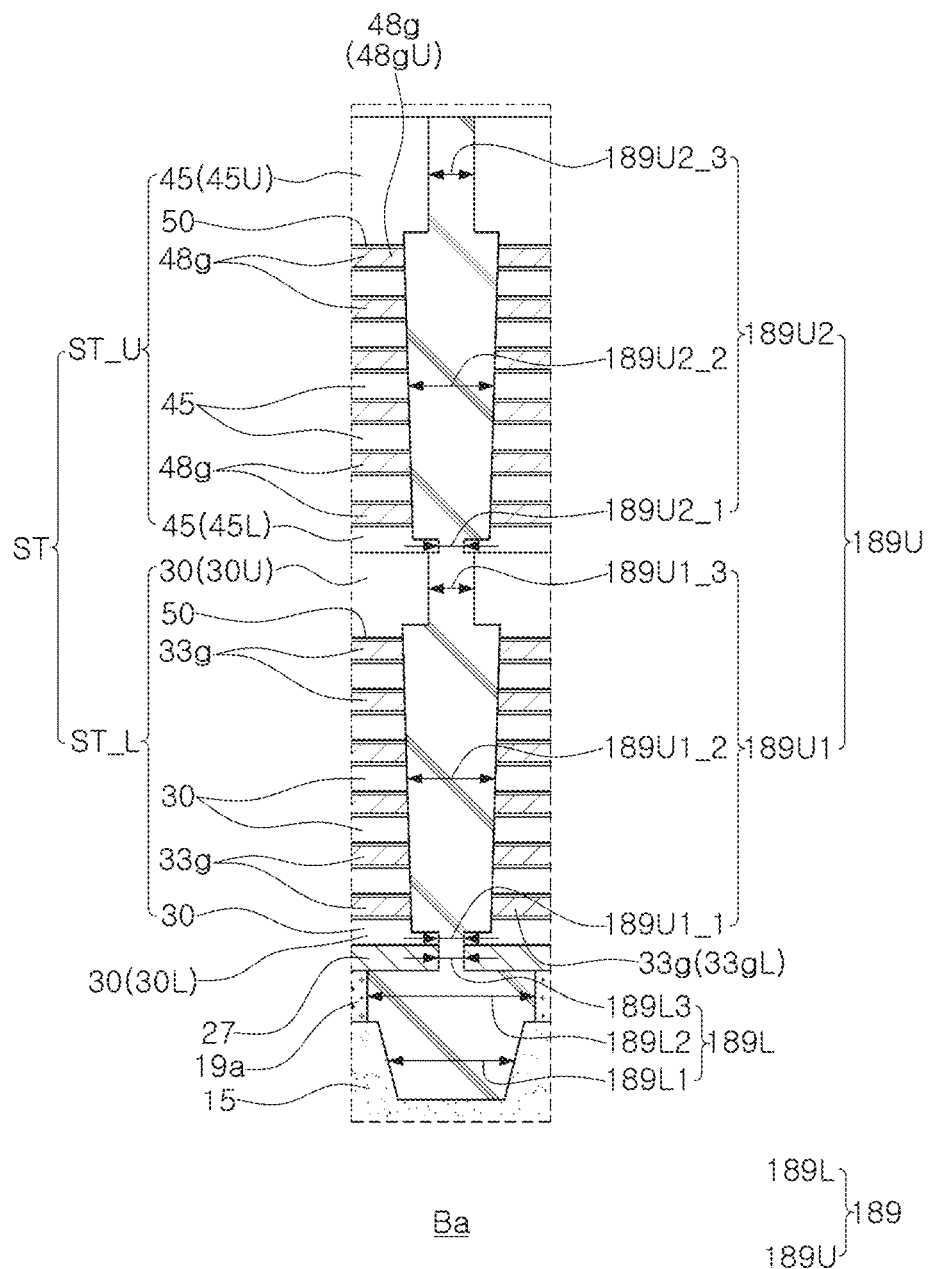
Figure 12B:
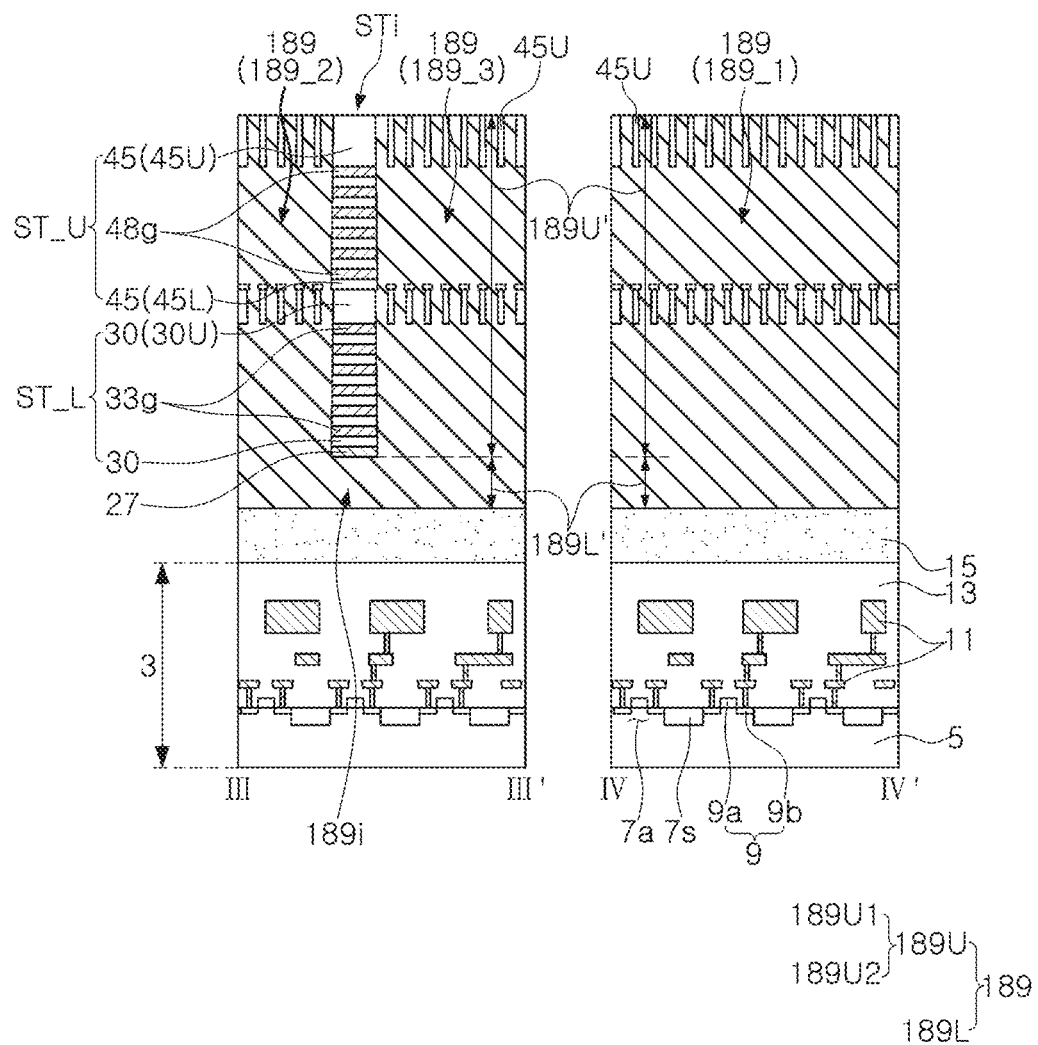

Referring to FIGS. 12A and 12B, the plurality of third lower portions 189L3 spaced apart from each other in the first (X) direction and formed in a pillar shape and the plurality of first portions 189U1_1, described in FIGS. 10A and 11, may be modified in a linear shape extending in the first (X) direction. Therefore, separation structures 189 may include a lower portion 189L' in which the plurality of third lower portions 189L3 formed in the pillar shape, as described with reference to FIGS. 10A and 11, are modified to have a linear shape, and an upper portion 189U' in which the plurality of first portions 189U1_1 formed in the pillar shape, as described with reference to FIGS. 10A and 11, are modified to have a linear shape.

Figure 13:
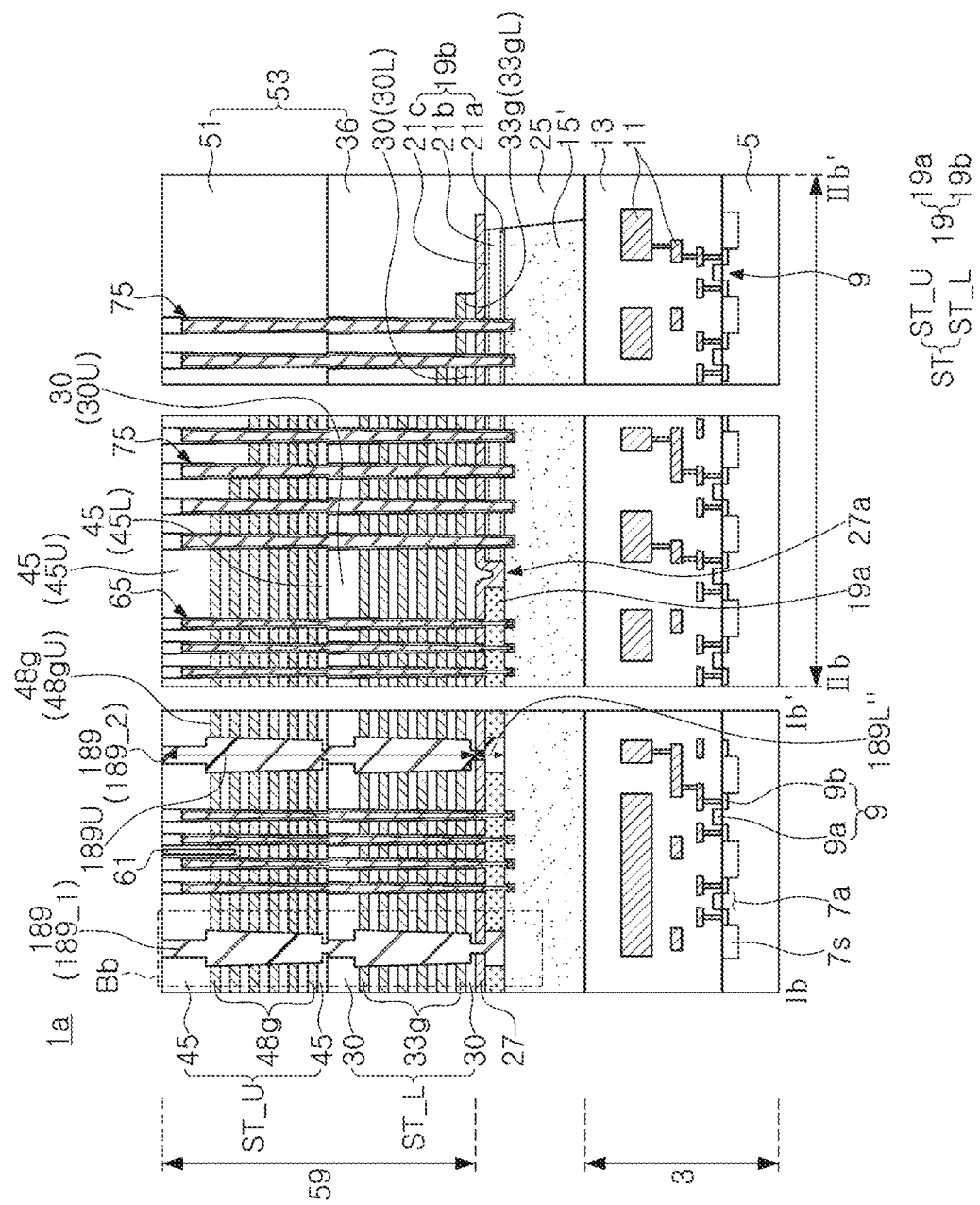
FIGS. 13 and 14 are views illustrating a modified example of a semiconductor device according to an example embodiment of the present inventive concepts.

Next, a modified example of a semiconductor device according to an example embodiment of the present inventive concepts will be described with reference to FIGS. 13 and 14. FIG. 13 may be a cross-sectional view schematically illustrating a region taken along line Ib-Ib' and a region taken along line IIb-IIb' in FIGS. 9A to 9E, and FIG. 14 may be a partial enlarged view schematically illustrating portion 'Bb' in FIG. 13.

Figure 14:
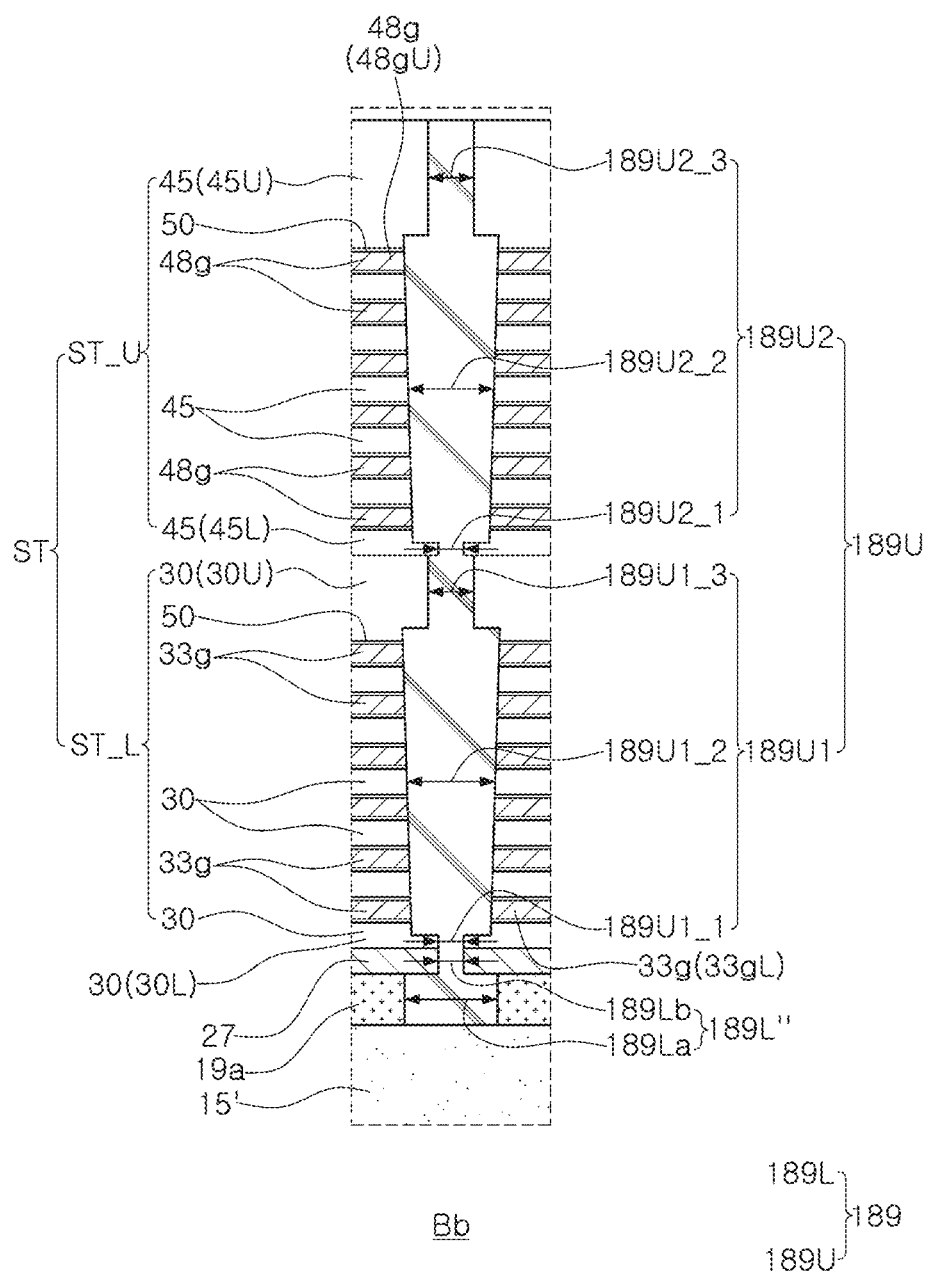

Referring to FIGS. 13 and 14, the plate layer 15 having the trench 17, described in FIG. 10A, may be modified as a plate layer 15', not having the trench 17. In separation structures 189, the lower portion 189L having a lower surface located on a level lower than that of the lower surface of the vertical memory structures 65, described in FIG. 10A may be replaced with a lower portion 189L" having a lower surface located on a level higher than that of the lower surface of the vertical memory structures 65.

In the separation structures 189, the lower portion 189L" may include a portion 189La penetrating through a first pattern layer 19a, and a portion 189Lb penetrating through an upper pattern layer 27.

In the lower portion 189L", both the portion 189La penetrating through the first pattern layer 19a and the portion 189Lb penetrating through the upper pattern layer 27 may have a width narrower than a width of a second portion 189U1_2 of an upper portion 189U that is adjacent to the lower portion 189L".

In the lower portion 189L", the portion 189Lb penetrating through the upper pattern layer 27 may be formed to have a plurality of pillar shapes spaced apart from each other in the first (X) direction.

Next, a modified example of a semiconductor device according to an example embodiment of the present inventive concepts will be described with reference to FIG. 15.

Figure 15:
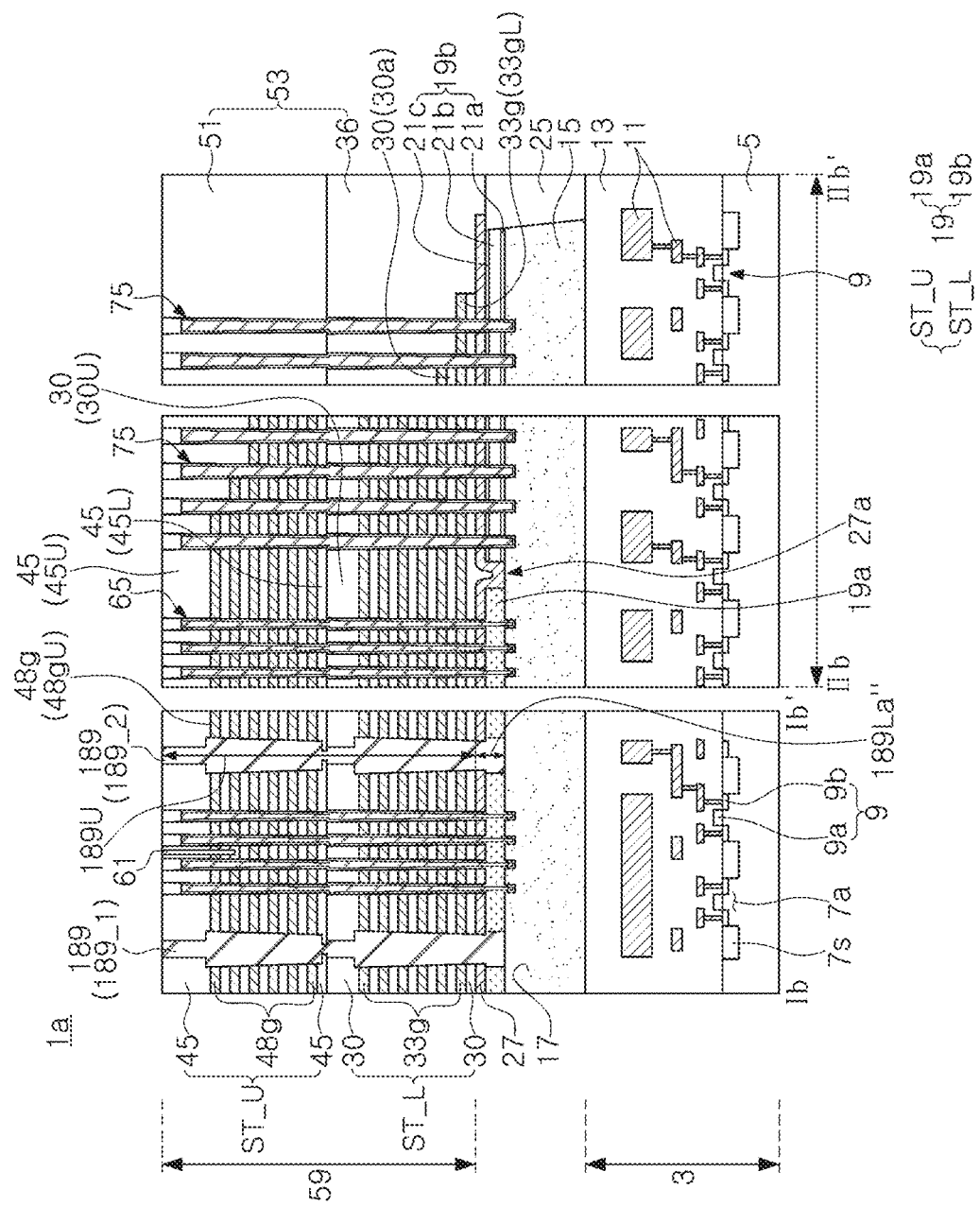
FIG. 15 is a cross-sectional view illustrating a modified example of a semiconductor device according to an example embodiment of the present inventive concepts.

FIG. 15 may be a cross-sectional view schematically illustrating a region taken along line Ib-Ib' and a region taken along line IIb-IIb' in FIGS. 9A to 9E.

Referring to FIG. 15, the lower portion 189L" including the portion formed to have the plurality of pillar shapes spaced apart from each other in the first (X) direction, as described in FIGS. 13 and 14, may be replaced with a lower portion 189La" formed in a linear shape entirely extending in the first (X) direction.

Figure 16A:
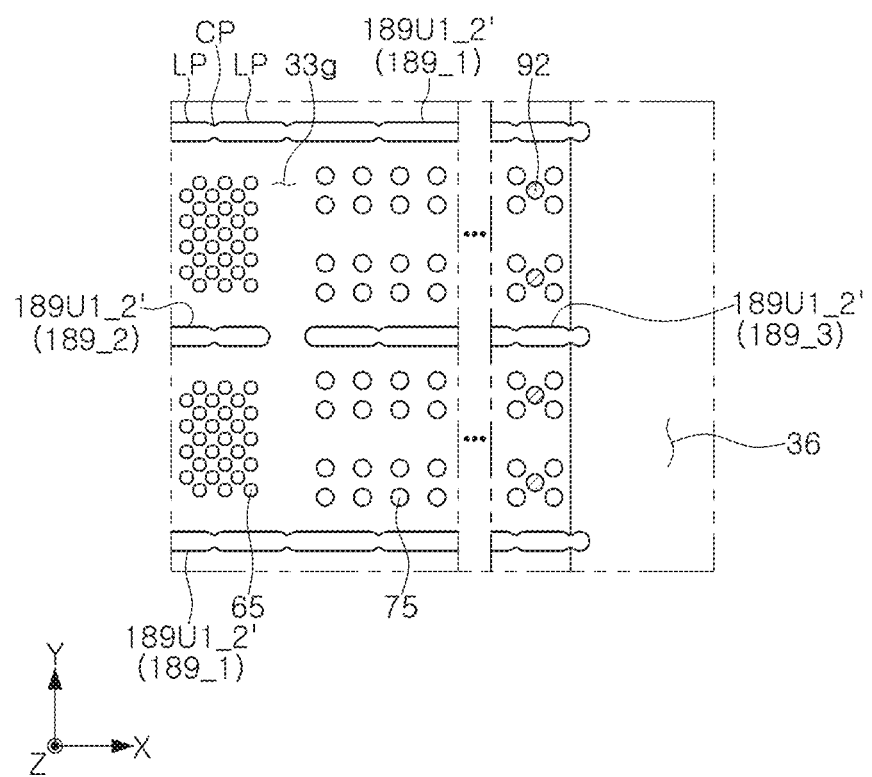
FIGS. 16A, 16B, and 16C are plan views illustrating a modified example of a semiconductor device according to an example embodiment of the present inventive concepts.

Next, a modified example of the separation structures 189 in plan view, described with reference to FIGS. 9A to 9E, will be described with reference to FIGS. 16A to 16C. FIG. 16A may be a plan view corresponding to FIG. 9A and illustrating modified components of the components of FIG. 9A, FIG. 16B may be a plan view corresponding to FIG. 9C and illustrating modified components of the components of FIG. 9C, and FIG. 16C may be a plan view corresponding to FIG. 9E and illustrating modified components of the components of FIG. 9E.

Figure 16B:
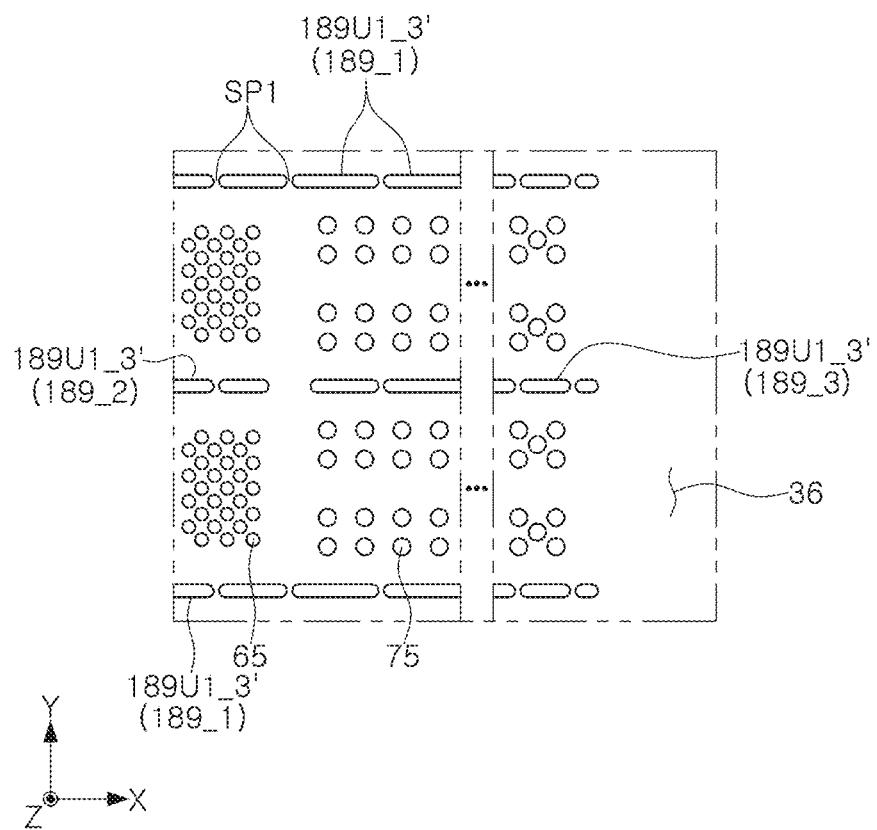
Figure 16C:
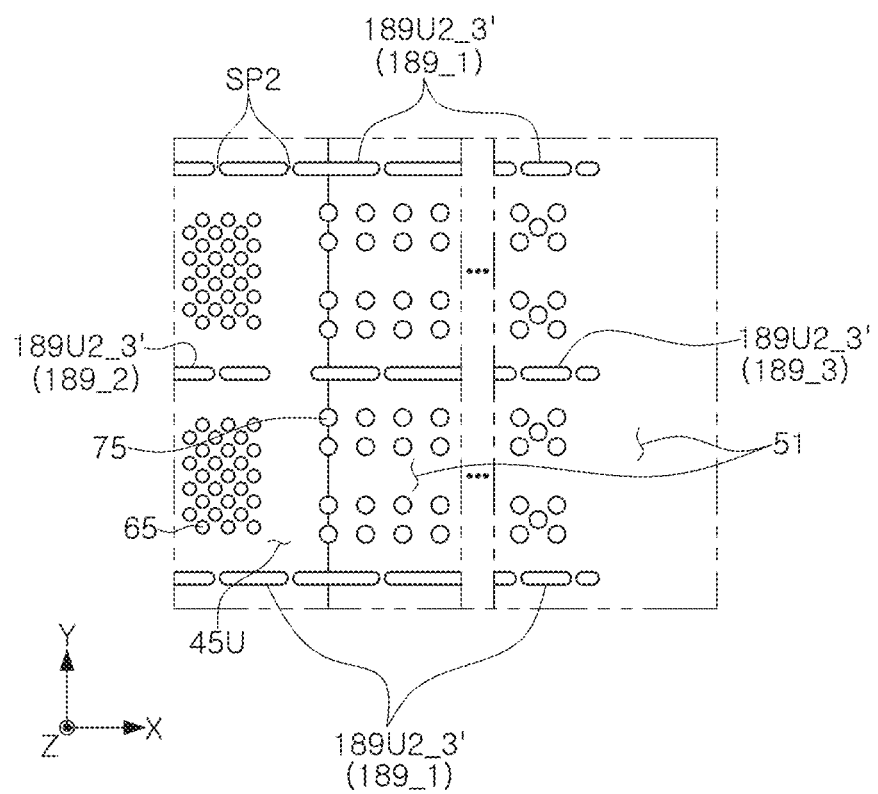

Referring to FIGS. 16A to 16C, the second portion 189U1_2 of the wave pattern, as described in FIG. 9A, may be replaced with a second portion (189U1_2' in FIG. 16A) having a side surface in which straight portions LP and concave portions CP are repeatedly arranged. The plurality of third portions 189U1_3 respectively having a circular shape, as described in FIG. 9C, may be replaced with a plurality of third portions 189U1_3' respectively having a bar shape. The plurality of sixth portions 189U2_3 respectively having a circular shape, as described in FIG. 9E, may be replaced with a plurality of sixth portions 189U2_3' respectively having a bar shape.

Figure 17A:
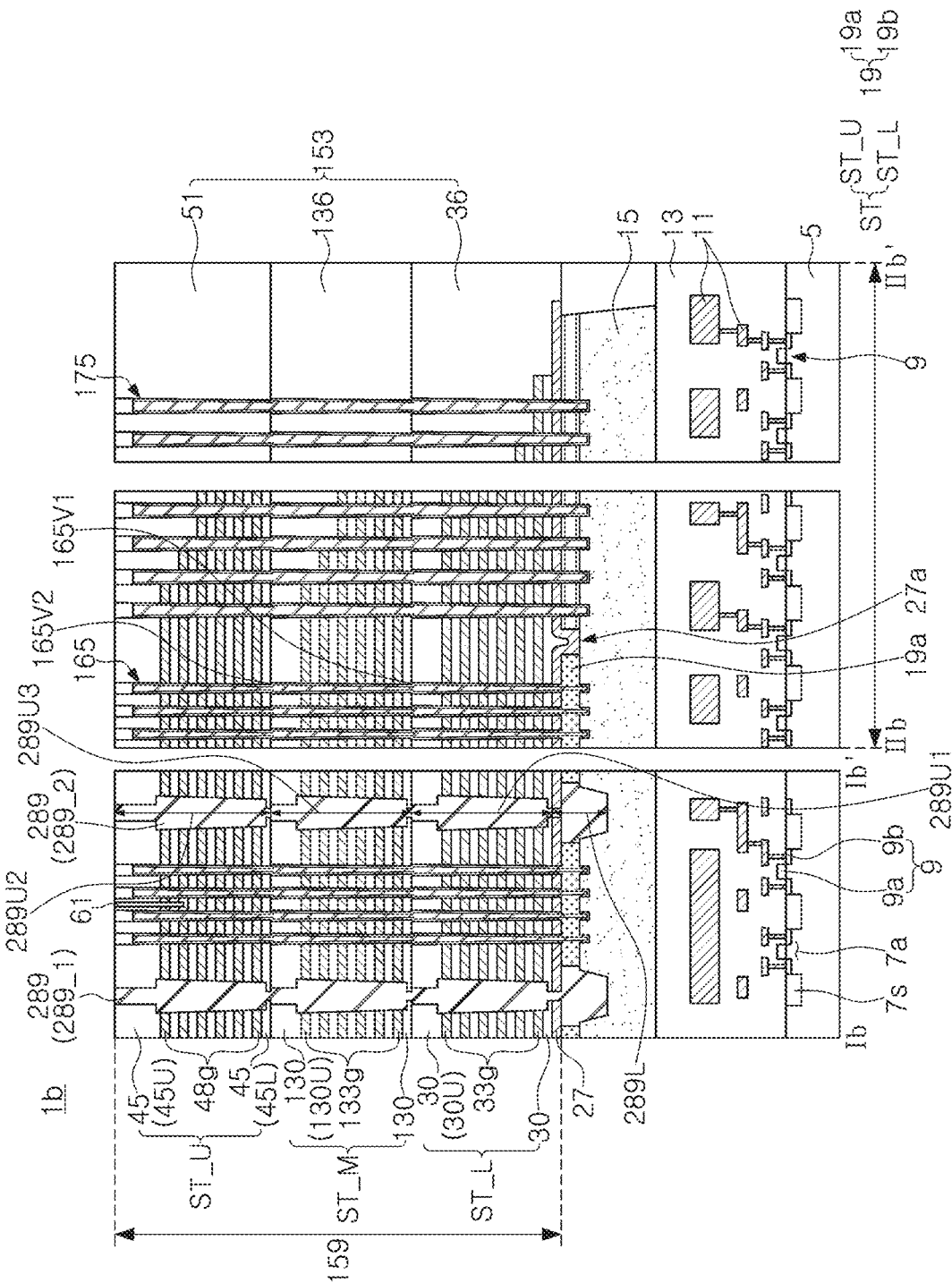
FIGS. 17A and 17B are views illustrating a modified example of a semiconductor device according to an example embodiment of the present inventive concepts.

Next, a modified example of a semiconductor device according to an example embodiment of the present inventive concepts will be described with reference to FIGS. 17A and 17B. FIG. 17A may be a cross-sectional view schematically illustrating a region taken along line Ib-Ib' and a region taken along line IIb-IIb' in FIGS. 9A to 9E, and FIG. 17B may be a cross-sectional view schematically illustrating a region taken along line IIIb-IIIb' and a region taken along line IVb-IVb' in FIGS. 9A to 9E.

Figure 17B:
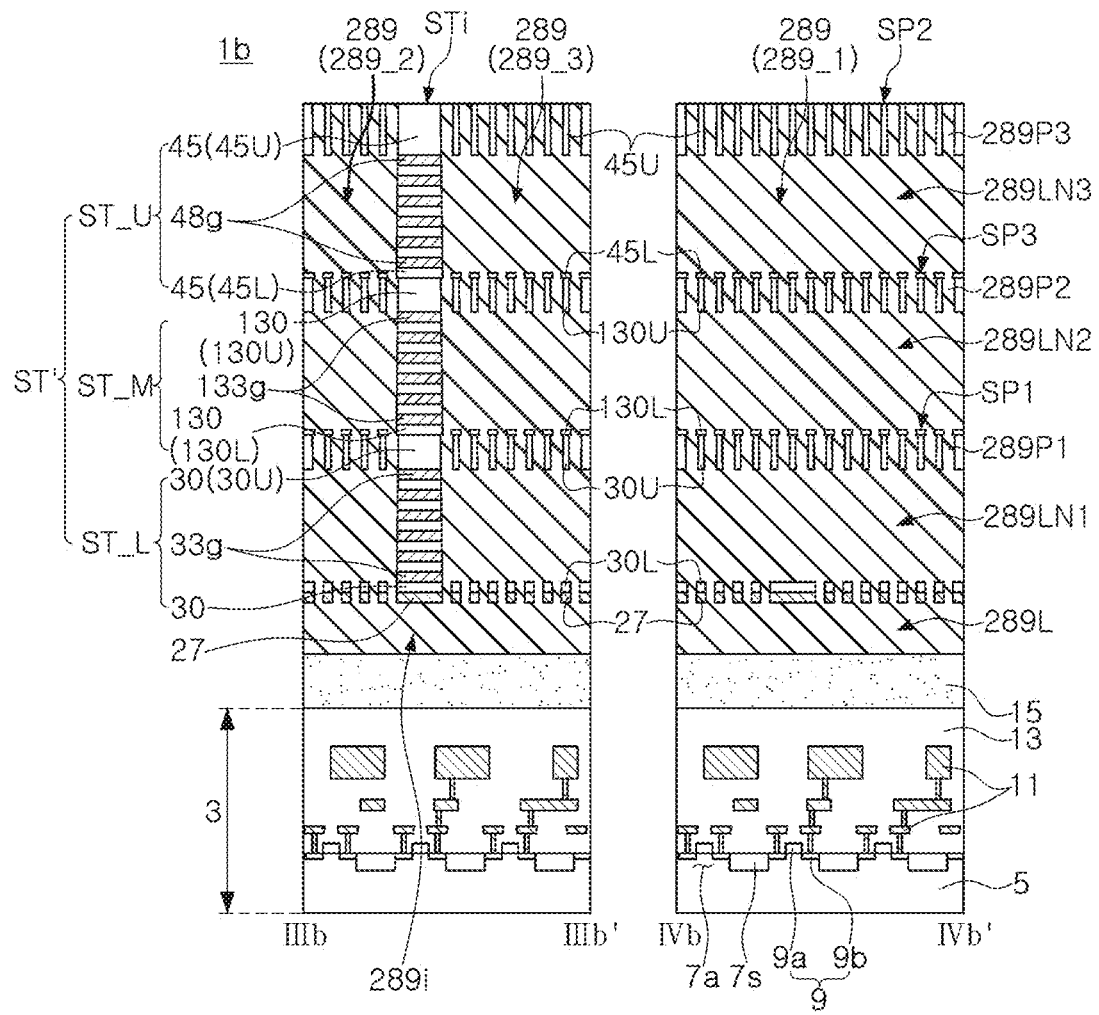

Referring to FIGS. 17A and 17B, in a semiconductor device 1b, the upper structure 59, as described in FIGS. 12A and 12B, may be replaced with an upper structure 159, which further includes an intermediate stack structure ST_M and an intermediate capping insulating layer 136 covering at least one side of the intermediate stack structure ST_M. The intermediate stack structure ST_M may be disposed between the lower stack structure ST_L and the upper stack structure ST_U, as described with reference to FIGS. 12A and 12B. The intermediate stack structure ST_M may include intermediate interlayer insulating layers 130 and intermediate gate layers 133g, alternately stacked. In the intermediate interlayer insulating layers 130, a lowermost intermediate interlayer insulating layer 130L may be disposed on an uppermost lower interlayer insulating layer 30U of a lower interlayer insulating layers 30, and an uppermost intermediate interlayer insulating layer 130U may be disposed below a lowermost upper interlayer insulating layer 45L among upper interlayer insulating layers 45.

A stack structure ST' including the lower stack structure ST_L, the intermediate stack structure ST_M, and the upper stack structure ST_U, sequentially stacked, may be configured. Therefore, the stack structure ST' may include interlayer insulating layers and gate layers, alternately stacked.

The capping insulating structure 153 may include the intermediate capping insulating layer 136, together with the lower and upper capping insulating layers 36 and 51, as described in FIGS. 12A and 12B.

In the semiconductor device 1b, the vertical memory structures 65, as described in FIGS. 12A and 12B, may be replaced with vertical memory structures 165 including a portion penetrating through the intermediate stack structure ST_M. The vertical support structures 75, as described in FIGS. 12A and 12B, may be replaced with vertical support structures 175 including a portion penetrating through the intermediate stack structure ST_M.

For example, a side surface of each of the vertical memory structures 165 may include a plurality of slope change portions 165V1 and 165V2 corresponding to the slope change portion (65V of FIG. 3) described with reference to FIG. 3. For example, a side surface of each of the vertical memory structures 165 may include a first slope change portion 165V1 and a second slope change portion 165V2 having a level higher than that of the first slope change portion 165V1.

The separation structures 189, as described in FIGS. 12A and 12B, may be replaced with separation structures 289 including a portion penetrating through the intermediate stack structure ST_M. The separation structures 289 may include first separation structures 289_1 parallel to each other, and a second separation structure 289_2 and a third separation structure 289_3 arranged between the first separation structures 289_1 and having opposite end portions (e.g., being arranged in a row). At least in a portion penetrating through the stack structure ST', each of the separation structures 289 may include a plurality of line portions 289LN1, 289LN2, and 289LN3 spaced apart from each other in the vertical (Z) direction and overlapping each other, and pillar portions 289P1, 289P2, and 289P3 disposed above the plurality of line portions 289LN1, 289LN2, and 289LN3, respectively. For example, in each of the separation structures 289, the plurality of line portions 289LN1, 289LN2, and 289LN3 may include a first line portion 289LN1, a second line portion 289LN2 on the first line portion 289LN1, and a third line portion 289LN3 on the second line portion 289LN2, wherein the pillar portions 289P1, 289P2, and 289P3 may include a plurality of first pillar portions 289P1 spaced apart from each other in the first (X) direction between the first line portion 289LN1 and the second line portion 289LN2, a plurality of second pillar portions 289P2 spaced apart from each other in the first (X) direction between the second line portion 289LN2 and the third line portion 289LN3, and a plurality of third pillar portions 289P3 spaced apart from each other in the first (X) direction on the third line portion 289LN3.

The semiconductor device 1b may include a first intermediate support structure SP1 disposed between the plurality of first pillar portions 289P1, a second intermediate support structure SP3 disposed between the plurality of second pillar portions 289P2, and an upper support structure SP2 disposed between the plurality of third pillar portions 289P3.

The first intermediate support structure SP1 may be formed of at least a portion of the uppermost lower interlayer insulating layer 30U and at least a portion of the lowermost intermediate interlayer insulating layer 130L. The second intermediate support structure SP3 may be formed of at least a portion of the uppermost intermediate interlayer insulating layer 130U and at least a portion of the lowermost upper interlayer insulating layer 45L. The upper support structure SP2 may be formed of at least a portion of the uppermost upper interlayer insulating layer 45U.

In each of the separation structures 289, the lower portion 289L may have the same or substantially similar structure as the lower portion of any one separation structure of the above-described example embodiments. For example, in each of the separation structures 289, the lower portion 289L may have the same or substantially similar structure as the lower portion 189L of the separation structures 189, as described with reference to FIGS. 10A and 10B.

Next, an example of a method of forming a semiconductor device according to an example embodiment of the present inventive concepts will be described with reference to FIGS. 18 to 25F. FIGS. 18 to 25F are views illustrating an example of a method of forming a semiconductor device according to an example embodiment of the present inventive concepts.

Figure 18:
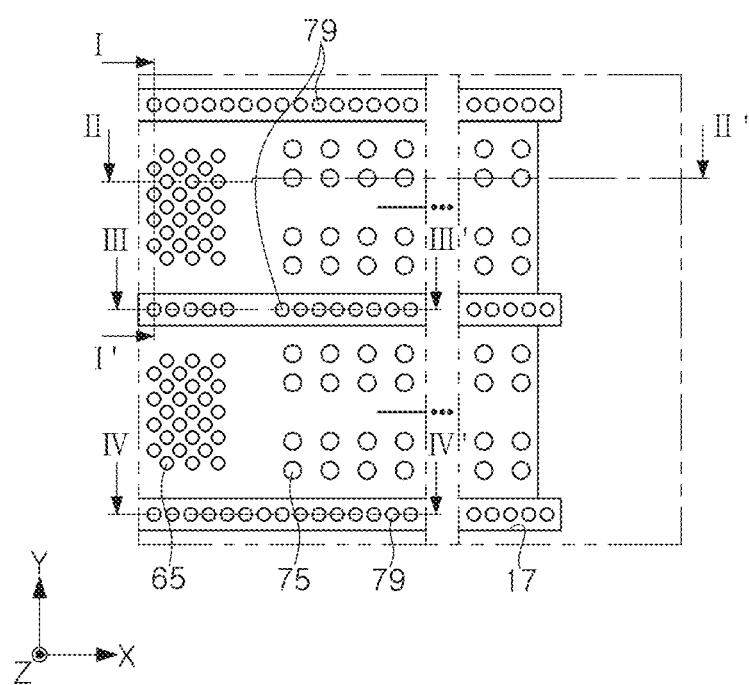
FIGS. 18 to 25F are views illustrating an example of a method of forming a semiconductor device according to an example embodiment of the present inventive concepts.
Figure 20A:
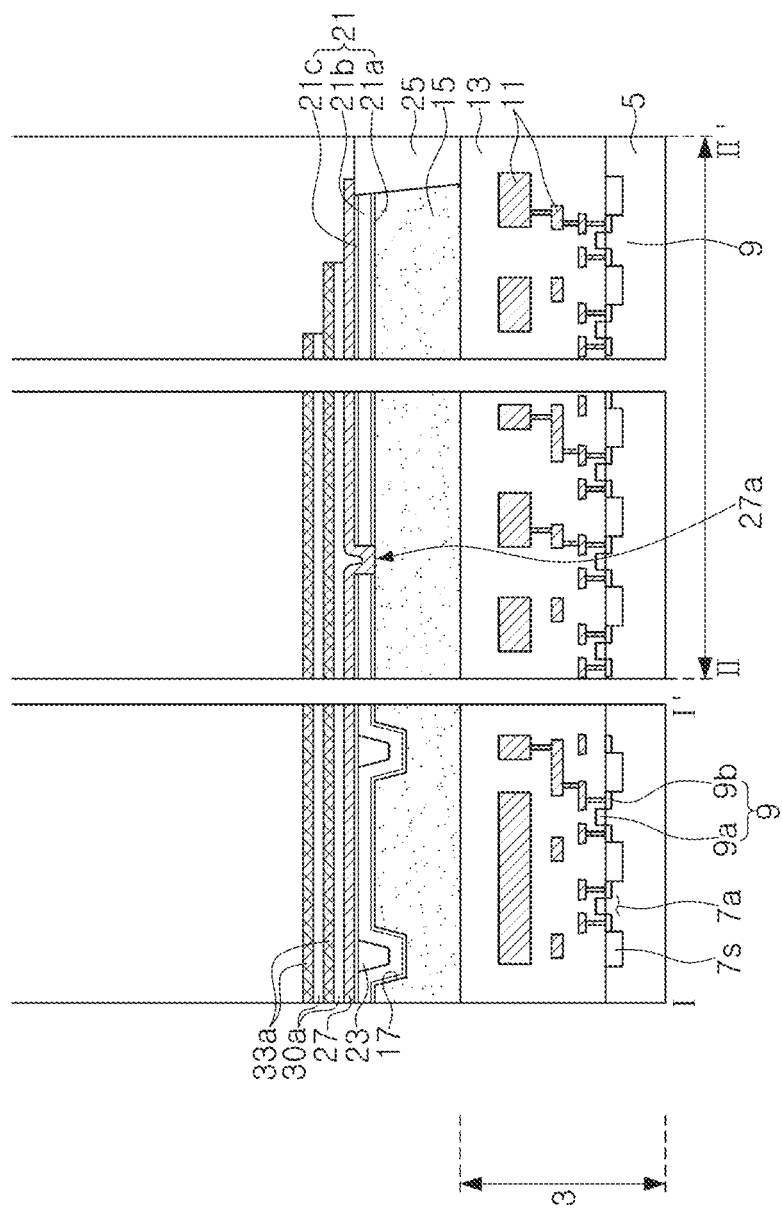
Figure 20B:
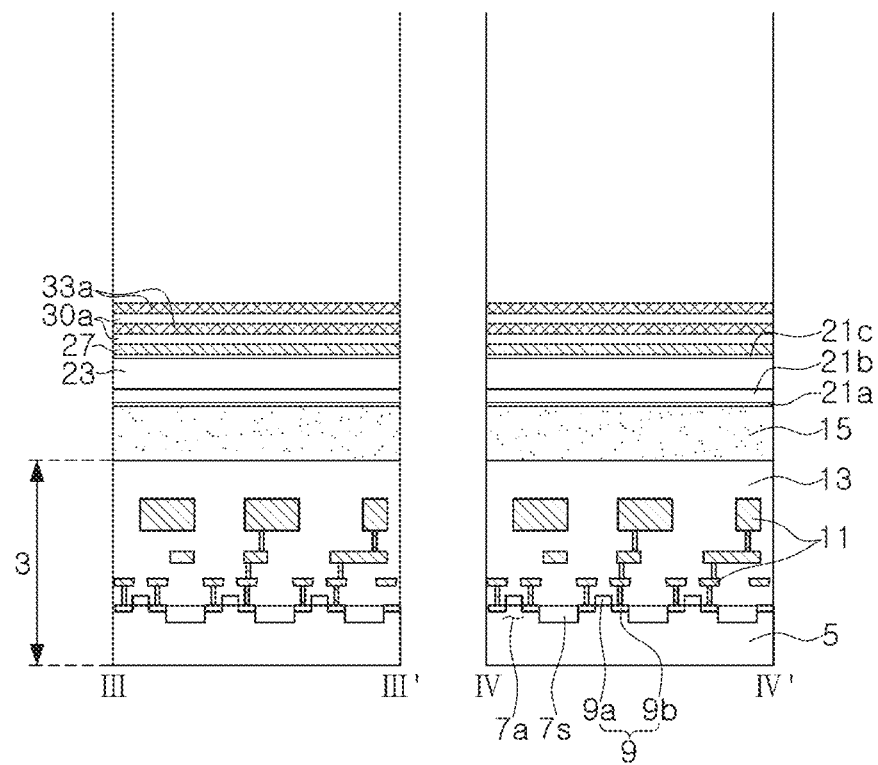
Figure 21A:
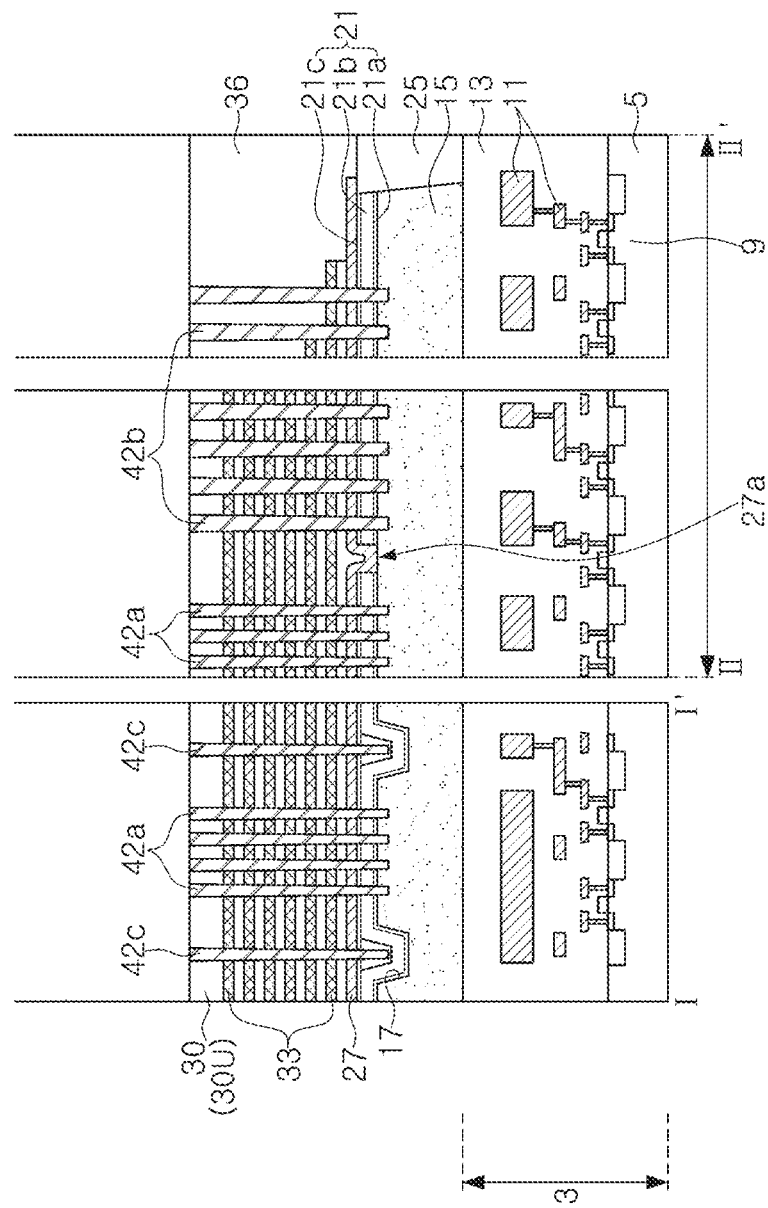
Figure 21B:
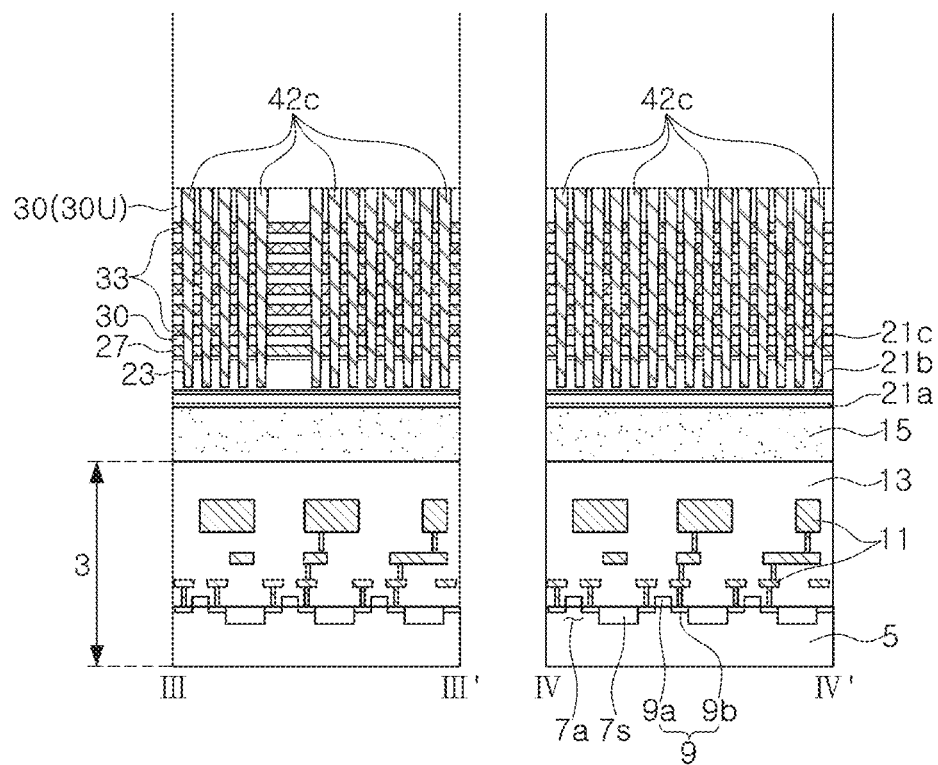
Figure 22A:
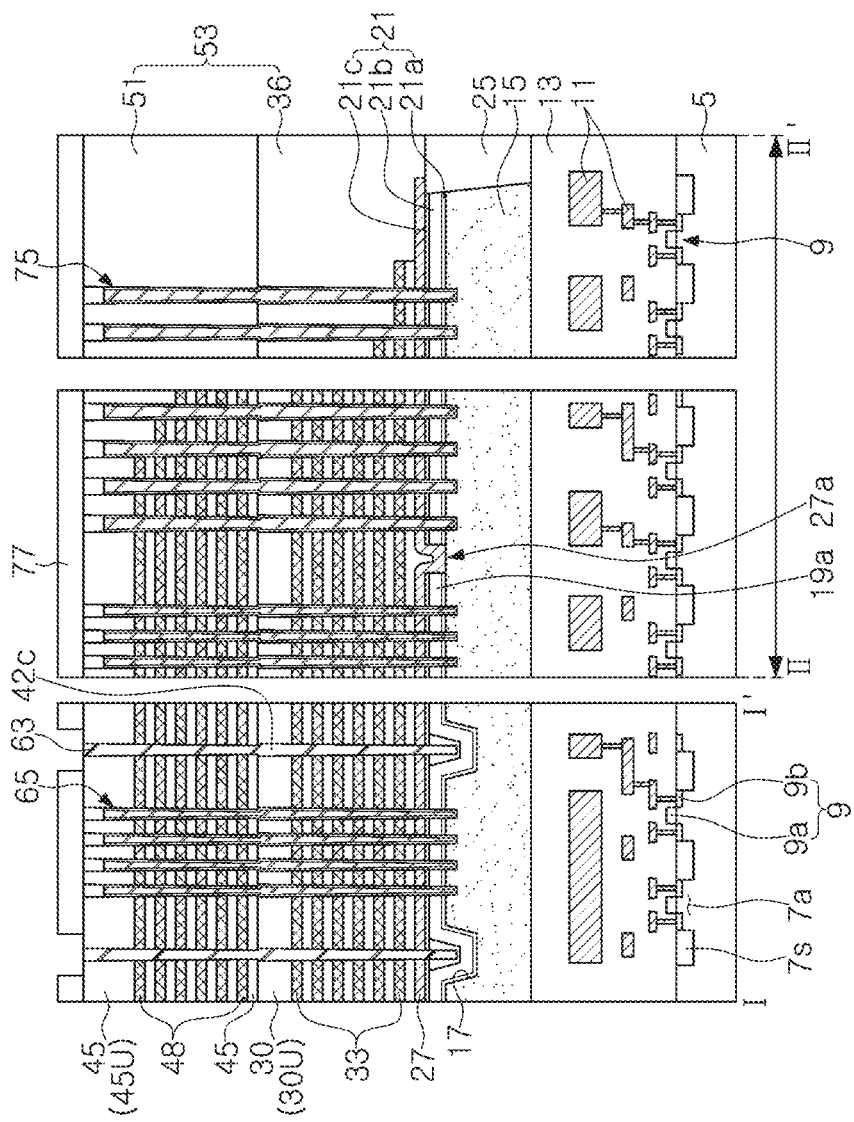
Figure 22B:
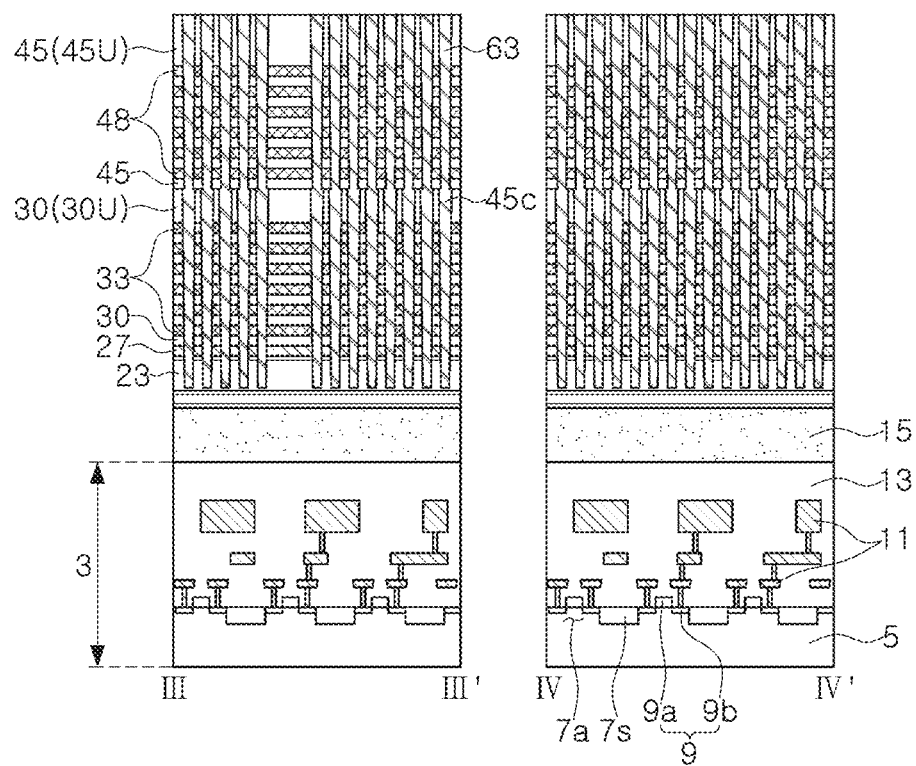
Figure 23A:
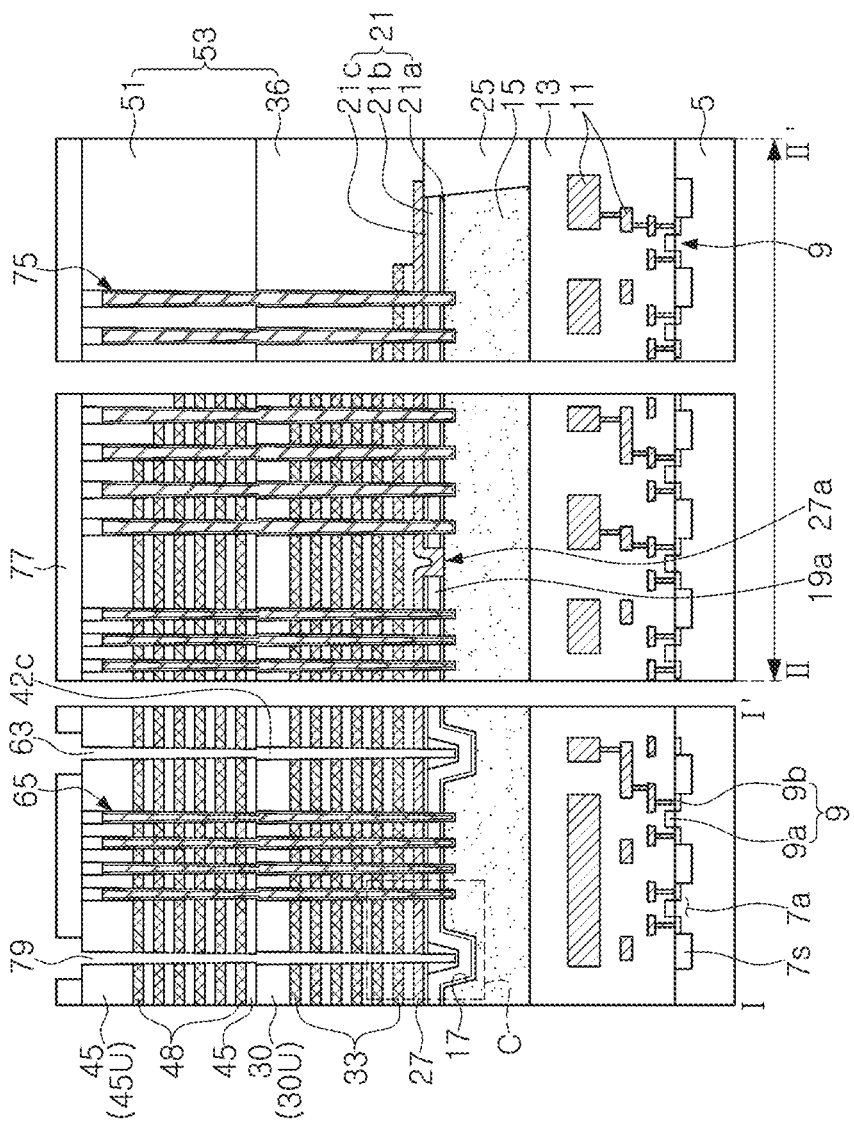
Figure 23B:
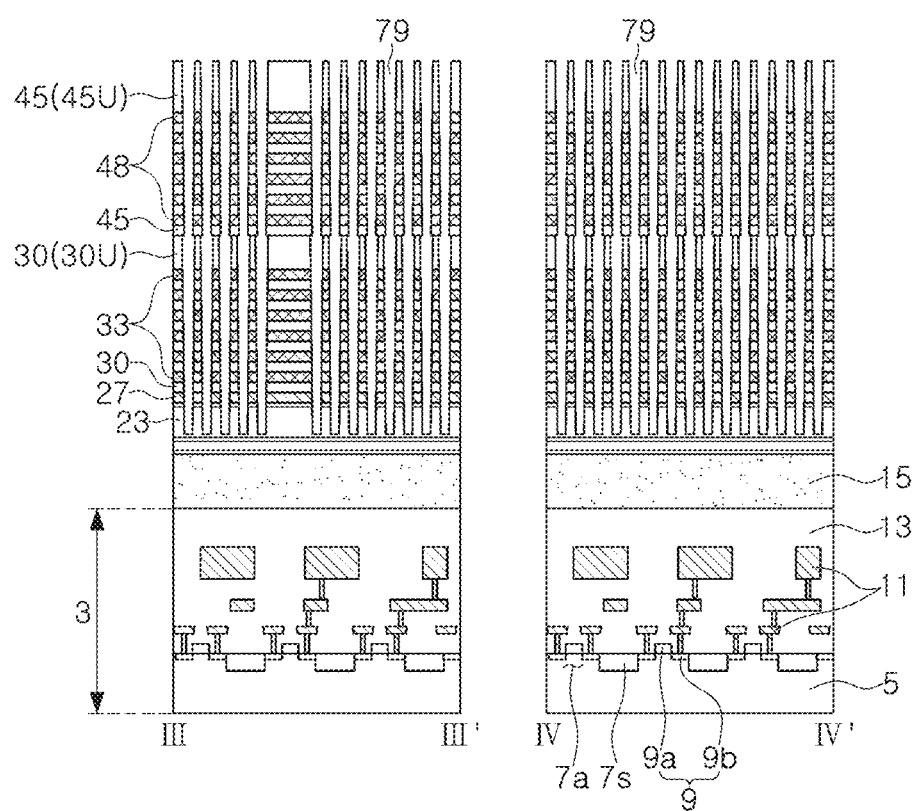
Figure 24:
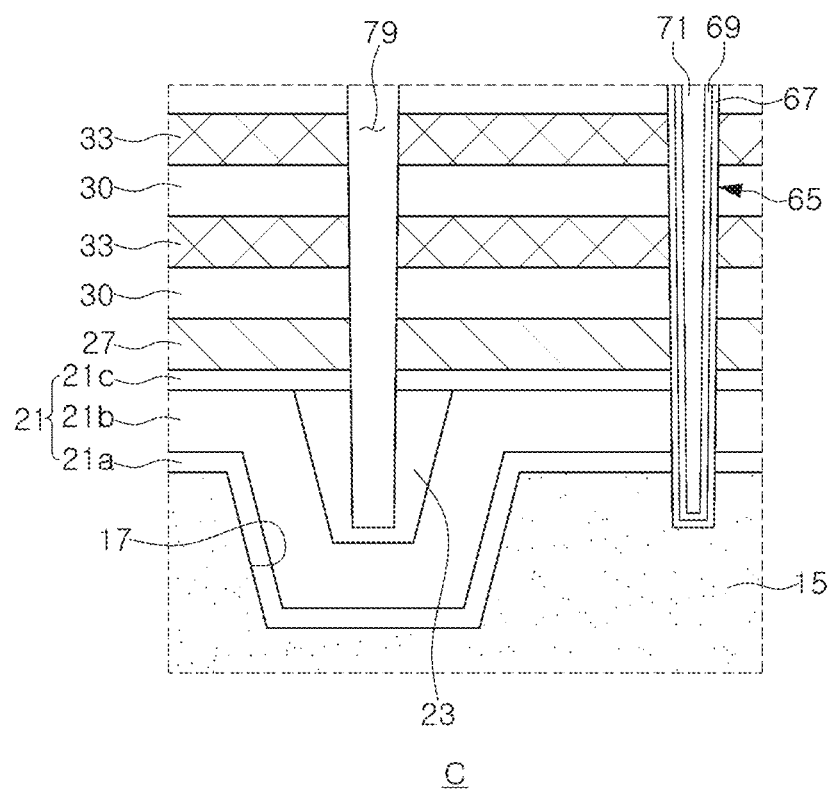

In FIGS. 18 to 25F, FIG. 18 may be a plan view schematically illustrating an example of a method of forming a semiconductor device according to an example embodiment of the present inventive concepts, FIGS. 19A, 20A, 21A, 22A, and 23A may be a cross-sectional view schematically illustrating a region taken along line I-I' and a region taken along line II-II' of FIG. 18, FIGS. 22B and 23B may be a cross-sectional view schematically illustrating a region taken along line III-III' and a region taken along line IV-IV' of FIG. 18A, FIG. 24 may be a partial enlarged view schematically illustrating portion 'C' in FIG. 23A, and FIGS. 25A to 25F may be partial enlarged views corresponding to the partially enlarged view of FIG. 24.

Figure 19A:
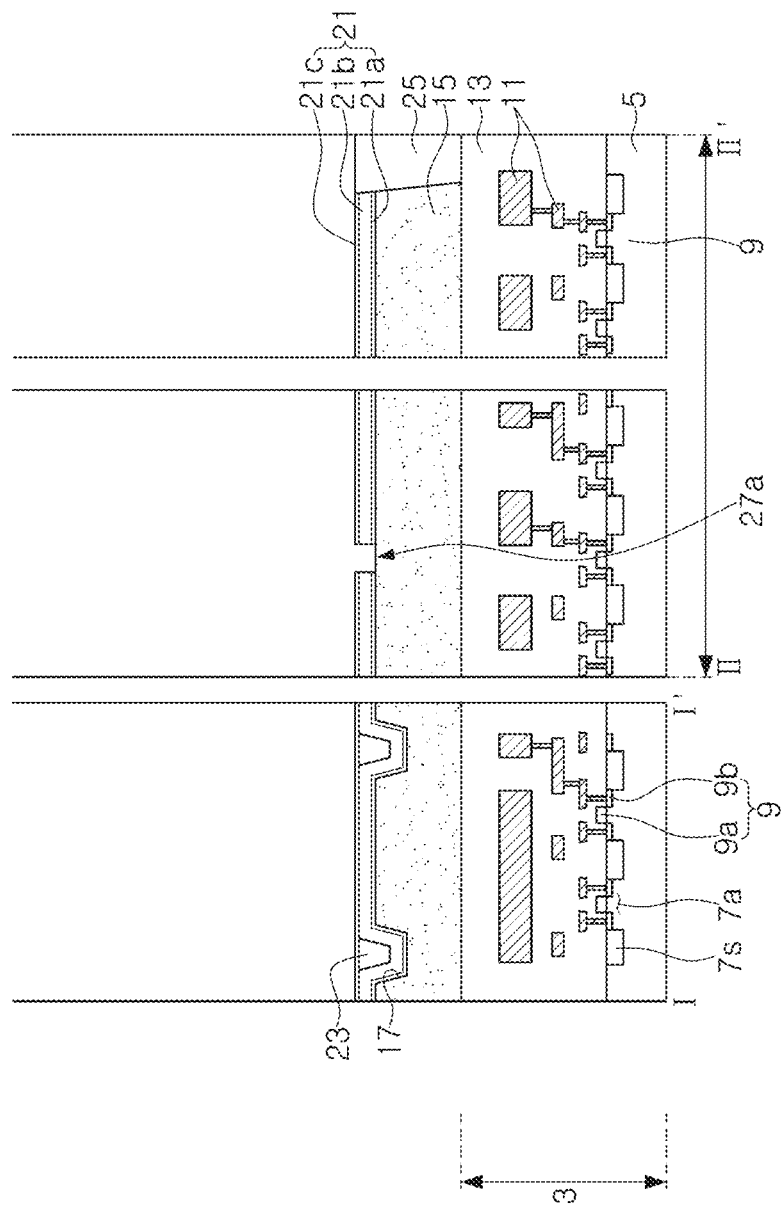
Figure 19B:
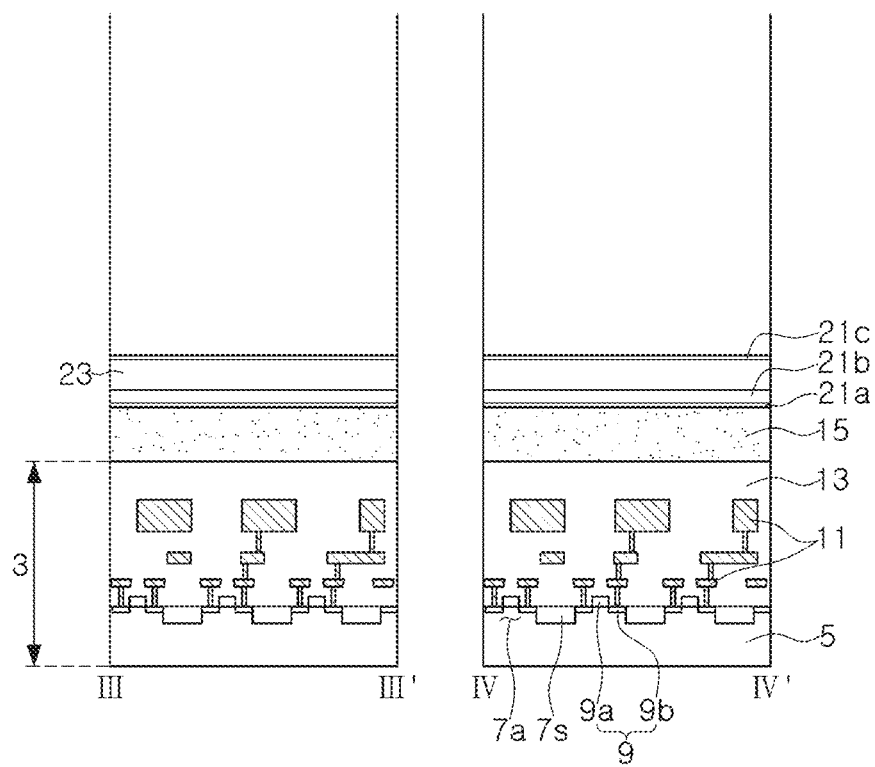

Referring to FIGS. 18, 19A, and 19B, a peripheral circuit structure 3 may be formed. The peripheral circuit structure 3 may include a semiconductor substrate 5, an device isolation layer 7s defining an active region 7a in the semiconductor substrate 5, a peripheral circuit 9 on the semiconductor substrate 5, a circuit interconnection 11 electrically connected to the peripheral circuit 9 on the semiconductor substrate 5, and a lower insulating layer 13 covering the peripheral circuit 9 and the circuit interconnection 11 on the semiconductor substrate 5. The peripheral circuit 9 may include a peripheral gate 9a on the active region 7a, and a peripheral source/drain 9b disposed in the active region 7a on both sides of the peripheral gate 9a.

A plate layer 15 may be formed on the peripheral circuit structure 3. The plate layer 15 may be formed as a silicon layer, for example, a doped silicon layer. For example, the plate layer 15 may be formed as a silicon layer having N-type conductivity.

Trenches 17 may be formed in the plate layer 15. A first intermediate layer 21a and a second intermediate layer 21b, covering inner walls of the trenches 17, extending onto an upper surface of the plate layer 15, and sequentially stacked, may be formed. The first intermediate layer 21a may be formed of silicon oxide, and the second intermediate layer 21b may be formed of silicon nitride. A thickness of the second intermediate layer 21b may be greater than a thickness of the first intermediate layer 21a.

A sacrificial layer may be formed on the second intermediate layer 21b, and the sacrificial layer may be planarized to form sacrificial gap-fill layers 23, filling the trenches 17, on the second intermediate layer 21b.

The sacrificial gap-fill layers 23 may be formed of a silicon material, but example embodiments are not limited thereto, and other materials may be substituted.

A third intermediate layer 21c may be formed on the second intermediate layer 21b and the sacrificial gap-fill layers 23. The third intermediate layer 21c may be formed of silicon oxide.

The first to third intermediate layers 21a, 21b, and 21c may be referred to as an intermediate layer 21.

An intermediate insulating layer 25 penetrating through the intermediate layer 21 and the plate layer 15 may be formed. The intermediate insulating layer 25 may be formed of silicon oxide.

An upper pattern layer 27 may be formed on the intermediate layer 21 and the intermediate insulating layer 25. The upper pattern layer 27 may be formed of a silicon material.

In an example, the intermediate layer 21 may have an opening exposing the plate layer 15, and the upper pattern layer 27 may have a portion to penetrate through the opening of the intermediate layer 21 to contact the plate layer 15.

Referring to FIGS. 18, 20A, and 20B, first lower mold structures 30a and 33a may be formed on the upper pattern layer 27. The first lower mold structures 30a and 33a may include first lower interlayer insulating layers 30a and first lower sacrificial gate layers 33a, alternately stacked.

At least one side of the first lower mold structures 30a and 33a may have a stepped shape.

Before forming the first lower mold structures 30a and 33a or while forming the first lower mold structures 30a and 33a, the upper pattern layer 27 may be patterned. A side surface of the upper pattern layer 27 may not be aligned with a side surface of the plate layer 15.

Referring to FIGS. 18, 21A, and 21B, a second lower mold structure may be formed on the first lower mold structures 30a and 33a. The second lower mold structure may include second lower interlayer insulating layers and second lower sacrificial gate layers, alternately stacked.

In some example embodiments, the first lower interlayer insulating layers 30a and the second lower interlayer insulating layers may be referred to as lower interlayer insulating layers 30, and the first lower sacrificial gate layers 33a and the second lower sacrificial gate layers will be referred to as lower sacrificial gate layers 33.

The lower interlayer insulating layers 30 and the lower sacrificial gate layers 33 may form lower mold structures 30 and 33. A lower capping insulating layer 36 covering at least one side of the lower mold structures 30 and 33 may be formed. Among the lower interlayer insulating layers 30 and the lower sacrificial gate layers 33, an uppermost layer may be an uppermost lower interlayer insulating layer 30U.

The lower capping insulating layer 36 and the lower mold structures 30 and 33 may constitute a first preliminary upper structure.

Lower sacrificial structures 42a, 42b, and 42c penetrating through the first preliminary upper structures 30, 33, and 36 and extending in a downward direction may be formed. The lower sacrificial structures 42a, 42b, and 42c may include lower sacrificial separation structures 42a, lower sacrificial vertical memory structures 42b, and lower sacrificial vertical support structures 42c.

The lower sacrificial separation structures 42a may sequentially penetrate through the first preliminary upper structures 30, 33, and 36 and the upper pattern layer 27, and may extend into the sacrificial gap-fill layers 23.

The sacrificial gap-fill layers 23 may serve as an etch stop layer. For example, in an etching process for forming the lower sacrificial separation structures 42a, since the sacrificial gap-fill layers 23 may serve as an etch stop layer, the lower sacrificial separation structures 42a may not be in contact with the plate layer 15. Therefore, it is possible to prevent the occurrence of defects while simultaneously forming the lower sacrificial structures 42a, 42b, and 42c.

The lower sacrificial vertical memory structures 42b and the lower sacrificial vertical support structures 42c may sequentially penetrate through the first preliminary upper structure 30, 33, and 36, the upper pattern layer 27, and the intermediate layer 21, and, may extend into the plate layer 15.

Referring to FIGS. 18, 22A and 22B, upper mold structures 45 and 48 may be formed on the first preliminary upper structures 30, 33, and 36. The upper mold structures 45 and 48 may include upper interlayer insulating layers 45 and upper sacrificial gate layers 48, alternately stacked. Among the upper interlayer insulating layers 45 and the upper sacrificial gate layers 48, an uppermost portion may be an uppermost upper interlayer insulating layer 45U. At least one side of the upper mold structures 45 and 48 may have a stepped shape. An upper capping insulating layer 51 covering at least one side of the upper mold structures 45 and 48 and covering the lower capping insulating layer 36 may be formed.

The lower capping insulating layer 36 and the upper capping insulating layer 51 may constitute a capping insulating structure 53.

The upper mold structures 45 and 48 and the upper capping insulating layer 51 may constitute second preliminary upper structures 45, 48, and 51.

Upper sacrificial structures penetrating through the second preliminary upper structures 45, 48, and 51 and contacting the lower sacrificial structures 42a, 42b, and 42c may be simultaneously formed. For example, the upper sacrificial structures may include upper sacrificial separation structures 63 contacting the lower sacrificial separation structures 42a.

After forming the upper sacrificial structures, a portion of the upper sacrificial structures contacting the lower sacrificial vertical memory structures 42b and the lower sacrificial support structures 42c may be removed, the lower sacrificial vertical memory structures 42b and the lower sacrificial support structures 42c may be removed to form holes, and vertical memory structures 65 and vertical support structures 75 may be formed in the holes.

In an example, the vertical memory structures 65 and the vertical support structures 75 may be formed simultaneously and may include layers having the same material.

In another example, after forming the vertical memory structures 65, the vertical support structures 75 may be formed.

Subsequently, a mask 77 covering the vertical memory structures 65 and the vertical support structures 75 and exposing the upper sacrificial separation structures 63 may be formed.

Referring to FIGS. 18, 23A, 23B, and 24, the upper sacrificial separation structures 63 exposed from the mask 77 may be removed, and the lower sacrificial separation structures 42a exposed by the removal of the upper sacrificial separation structures 63 may be removed, to form separation holes 79 exposing the sacrificial gap-fill layers 23.

Next, a subsequent process will be described with reference to FIGS. 25A to 25F. In this case, any one separation hole of the separation holes 79 will be mainly described.

Figure 25A:
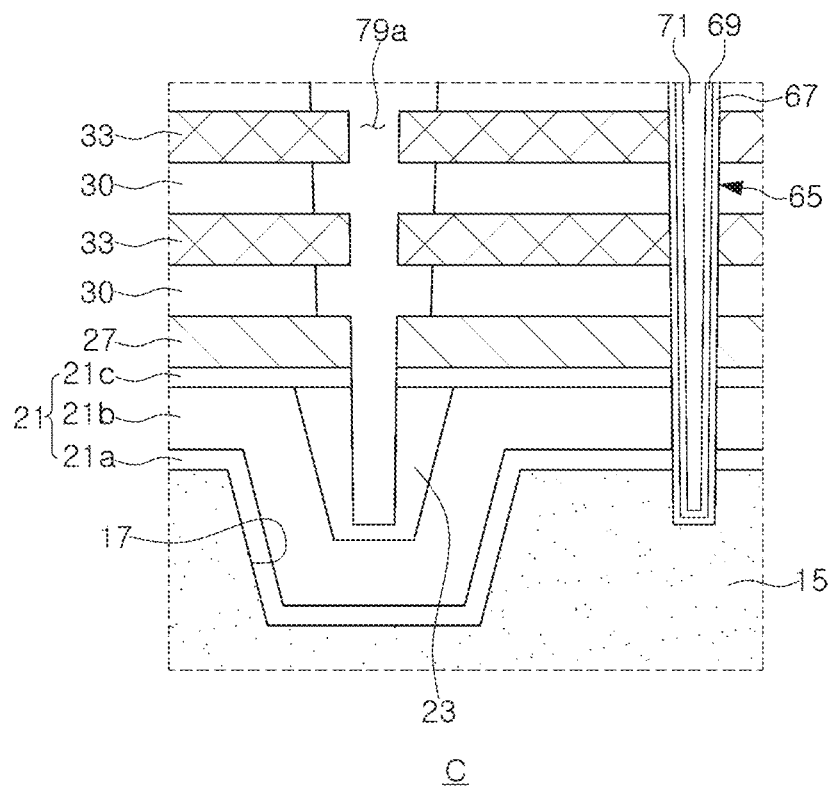

Referring to FIG. 25A, the lower and upper interlayer insulating layers 30 and 45 and the third intermediate layer 21c, exposed by the separation holes 79, may be partially etched to form a partially expanded separation hole 79a.

Figure 25B:
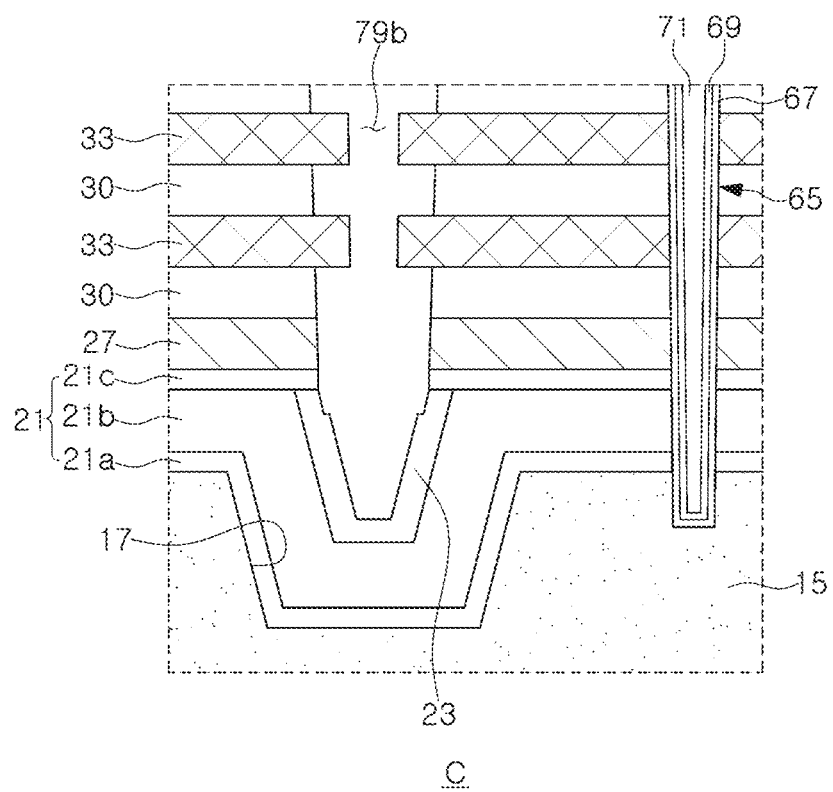

Referring to FIG. 25B, the upper pattern layer 27 and the sacrificial gap-fill layer 23 may be partially etched to form a partially expanded separation hole 79b.

Figure 25C:
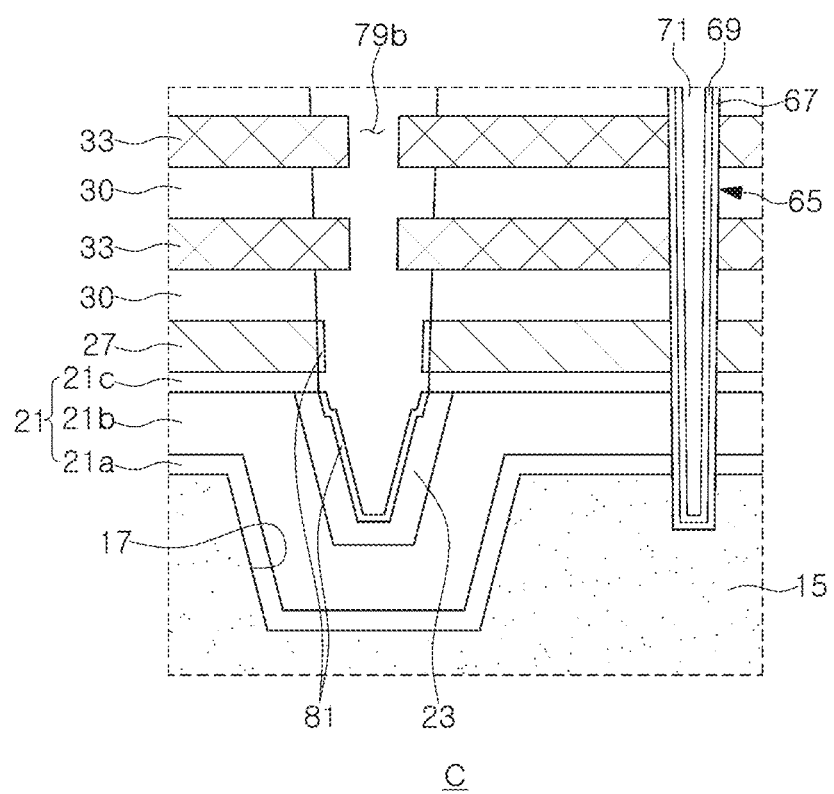

Referring to FIG. 25C, the upper pattern layer 27 and the sacrificial gap-fill layer 23, partially etched, may be oxidized to form a sacrificial oxide layer 81.

Figure 25D:
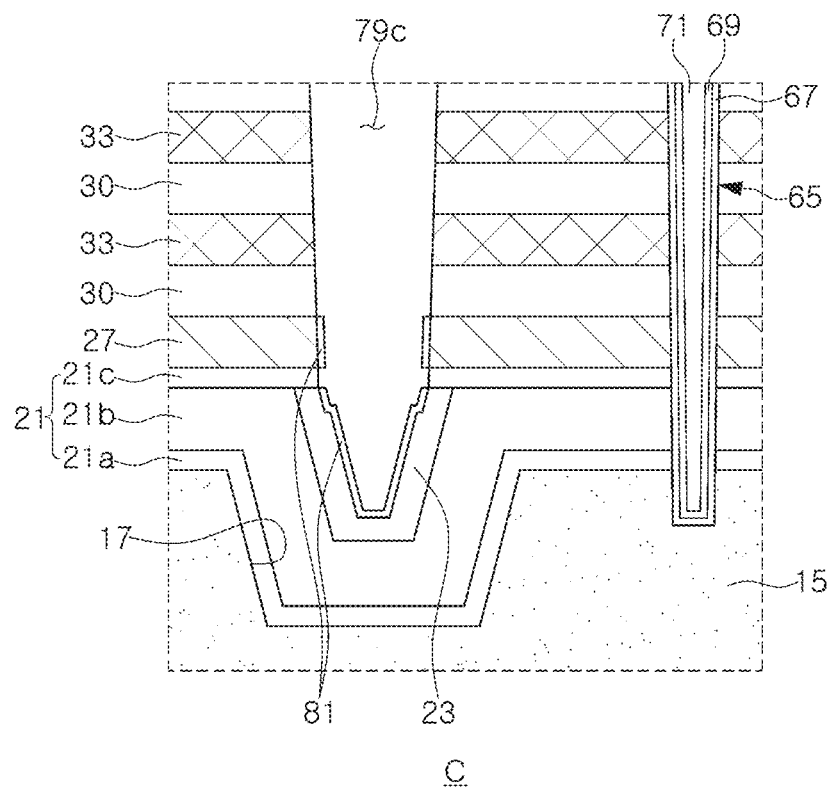

Referring to FIG. 25D, the lower and upper sacrificial gate layers 33 and 48 may be partially etched, to form the separation hole 79b as a separation opening 79c having a linear shape. For example, separation holes 79b adjacent to each other may be connected to each other to form a separation opening 79c.

Figure 25E:
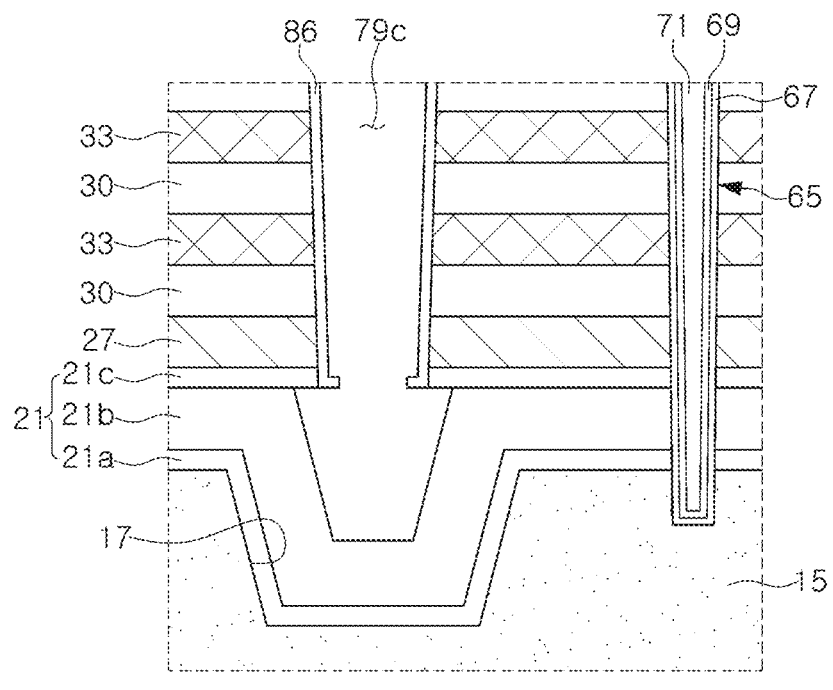

Referring to FIG. 25E, a sacrificial spacer 86 may be formed on a side surface of the separation opening 79c.

Figure 25F:
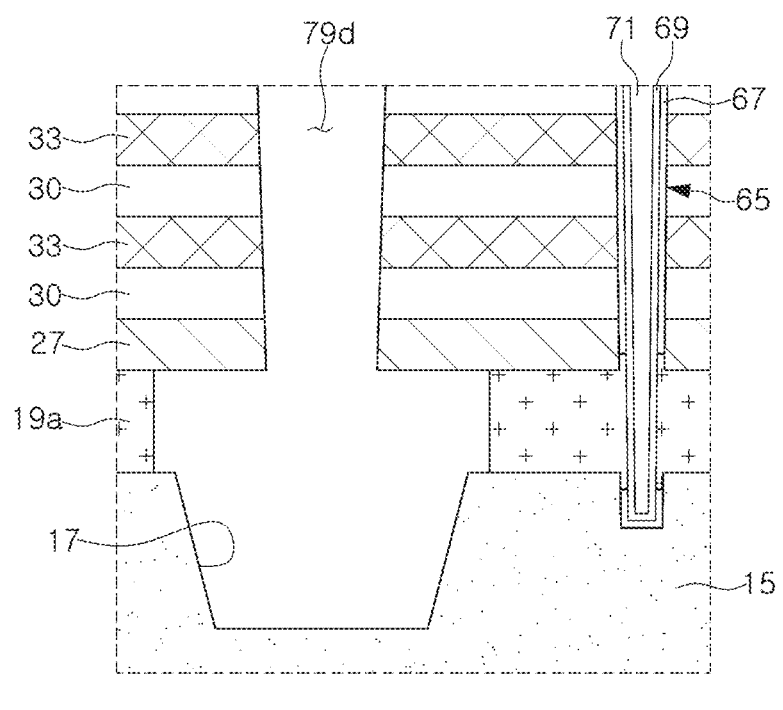

Referring to FIG. 25F, the second intermediate layer 21b may be etched using the sacrificial spacer 86 as an etching mask, and the first and third intermediate layers 21a and 21c and the data storage structure 67 may be etched to form an empty space. A first pattern layer 19a may be formed in the empty space. While the first and third intermediate layers 21a and 21c and the data storage structure 67 are etched, the sacrificial spacer 86 may be etched and removed.

Again, referring to FIGS. 1, 2A, and 2B, the lower and upper sacrificial gate layers 33 and 48 may be selectively removed to form empty spaces, and gate layers may be formed in the empty spaces.

Subsequently, separation structures 89 filling the separation openings 79d may be formed.

Next, a modified example of a semiconductor device according to an example embodiment of the present inventive concepts will be described with reference to FIG. 26.

Figure 26:
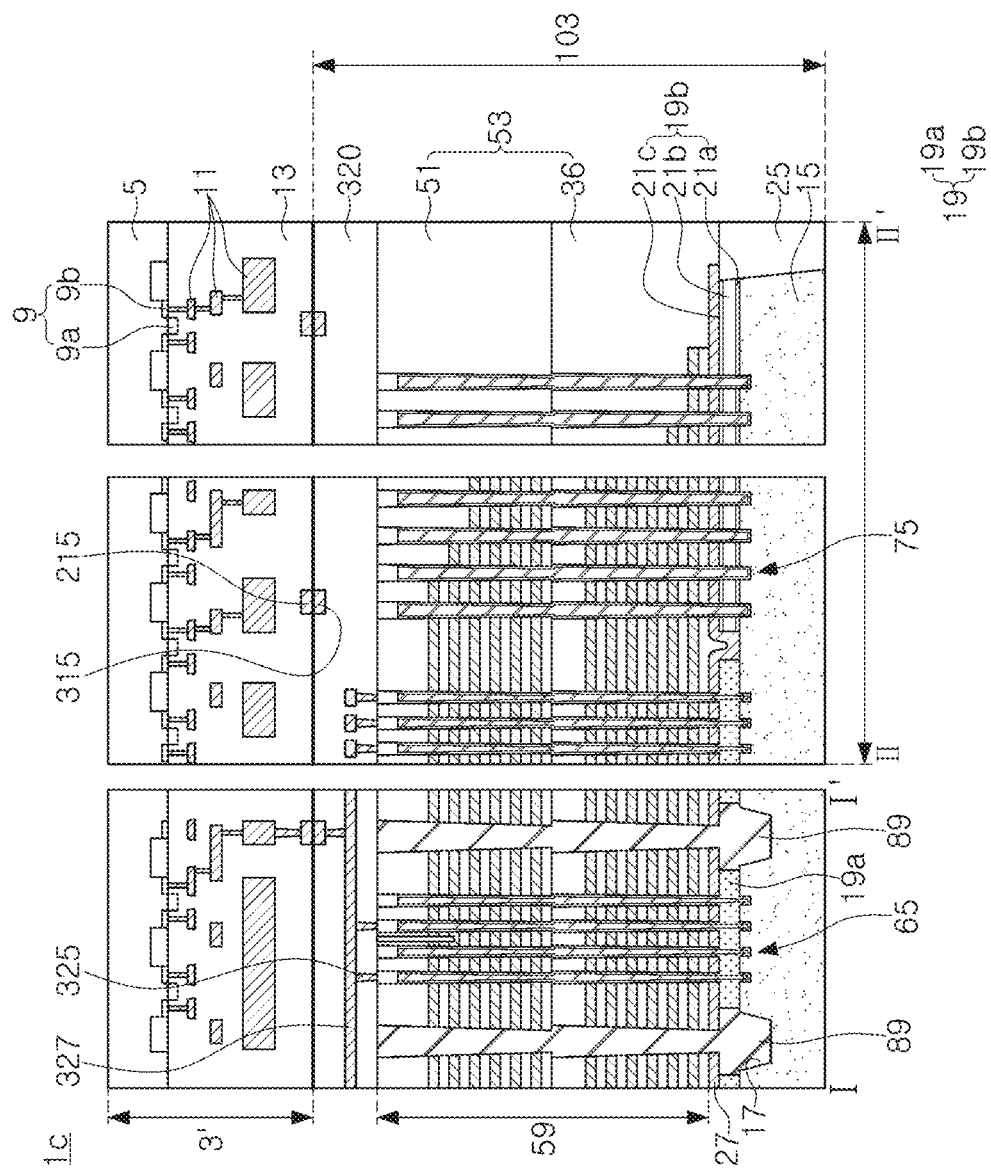
FIG. 26 is a cross-sectional view illustrating a modified example of a semiconductor device according to an example embodiment of the present inventive concepts.

FIG. 26 may be a cross-sectional view schematically illustrating a region taken along line I-I' and a region taken along line II-II' of FIG. 1.

Referring to FIG. 26, a semiconductor device Ic may include a first structure 103 and a second structure 3' on the first structure 103.

The first structure 103 may be a memory chip, and the second structure 3' may be a logic chip. The second structure 3' may be a peripheral circuit structure.

The first structure 103 may include a plate layer 15, an upper structure 59, vertical memory structures 65, vertical support structures 75, and separation structures 89, as described with reference to FIGS. 1 to 2B.

The first structure 103 may further include bit line contact plugs 325 disposed on the upper structure 59 and electrically connected to the vertical memory structures 65, and bit lines 327 on the bit line contact plugs 325.

The first structure 103 may further include an insulating layer 320 disposed on the upper structure 59 and covering the bit line contact plugs 325 and the bit lines 327. The first structure 103 may further include first bonding metal patterns 315 coplanar with an upper surface of the insulating layer 320 and buried in the insulating layer 320.

The second structure 3' may include a semiconductor substrate 5, a peripheral circuit 9 including a peripheral gate 9a and a peripheral source/drain 9b on the semiconductor substrate 5, a circuit interconnection 11 electrically connected to the peripheral circuit 9 on the semiconductor substrate 5, and an insulating layer 13 covering the peripheral circuit 9 and the circuit interconnection 11 on the semiconductor substrate 5. The second structure 3' may further include second bonding metal patterns 215 coplanar with an upper surface of the insulating layer 13 and buried in the insulating layer 13. The upper surface of the insulating layer 320 and upper surfaces of the first bonding metal patterns 315 in the first structure 103 may be in contact with and connected to the upper surface of the insulating layer 13 and upper surfaces of the second bonding metal patterns 215 in the second structure 3', respectively.

Next, a modified example of the semiconductor device according to an example embodiment of the present inventive concepts will be described with reference to FIG. 27.

Figure 27:
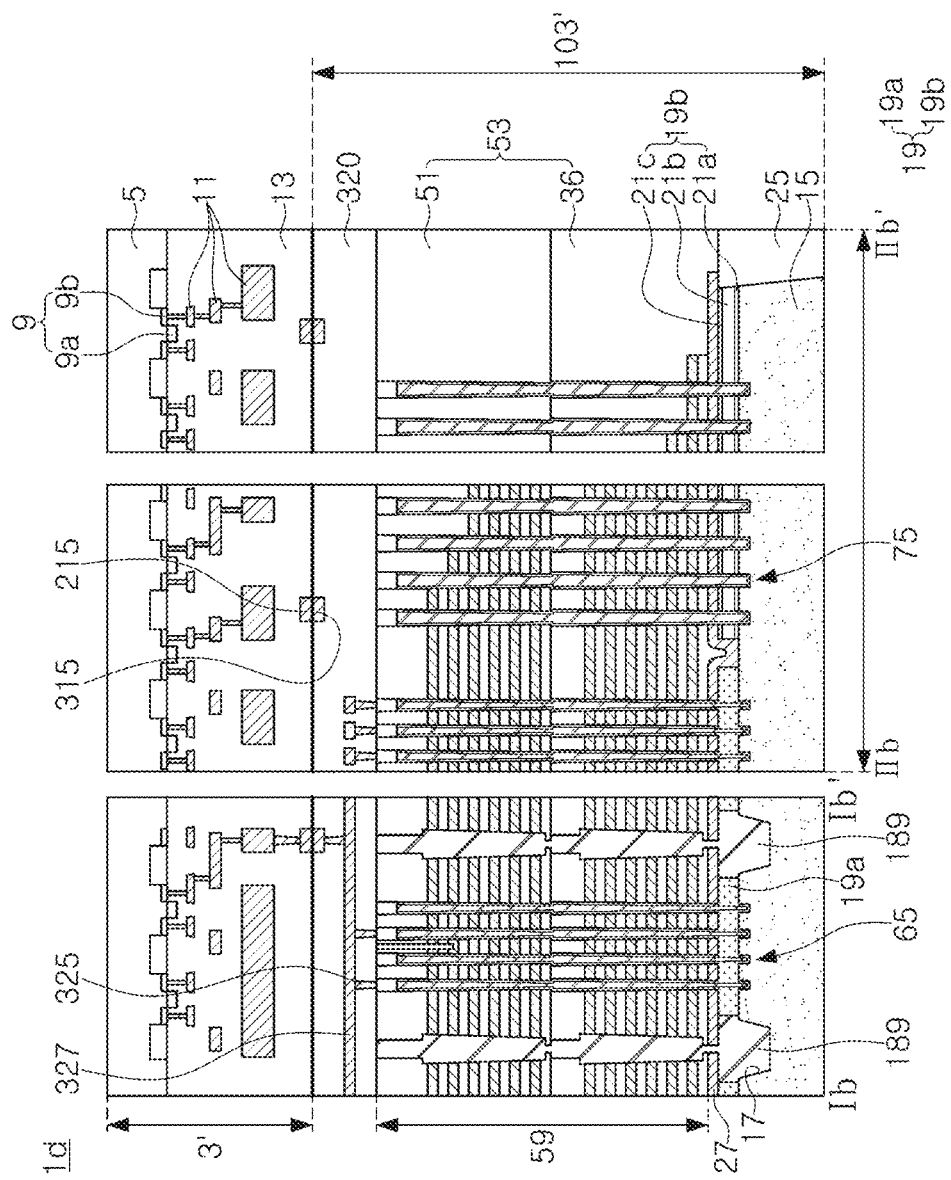
FIG. 27 is a cross-sectional view illustrating a modified example of a semiconductor device according to an example embodiment of the present inventive concepts.

FIG. 27 may be a cross-sectional view schematically illustrating a region taken along line Ib-Ib' and a region taken along line IIb-IIb' of FIGS. 9A to 9E.

Referring to FIG. 27, a semiconductor device 1d may include a first structure 103', and a second structure 3' disposed on the first structure 103' and substantially identical to that described with reference to FIG. 26.

The first structure 103' may include a plate layer 15, an upper structure 59, vertical memory structures 65, vertical support structures 75, and separation structures 189, as described with reference to FIGS. 9A to 11. The first structure 103' may further include bit line contact plugs 325 disposed on the upper structure 59 and electrically connected to the vertical memory structures 65, and bit lines 327 on the bit line contact plugs 325. The first structure 103' may further include an insulating layer 320 disposed on the upper structure 59 and covering the bit line contact plugs 325 and the bit lines 327. The first structure 103' may further include first bonding metal patterns 315 coplanar with an upper surface of the insulating layer 320 and buried in the insulating layer 320. The upper surface of the insulating layer 320 and upper surfaces of the first bonding metal patterns 315 in the first structure 103' may be in contact with and connected to an upper surface of the insulating layer 13 and upper surfaces of second bonding metal patterns 215 in the second structure 3', respectively.

Figure 28:
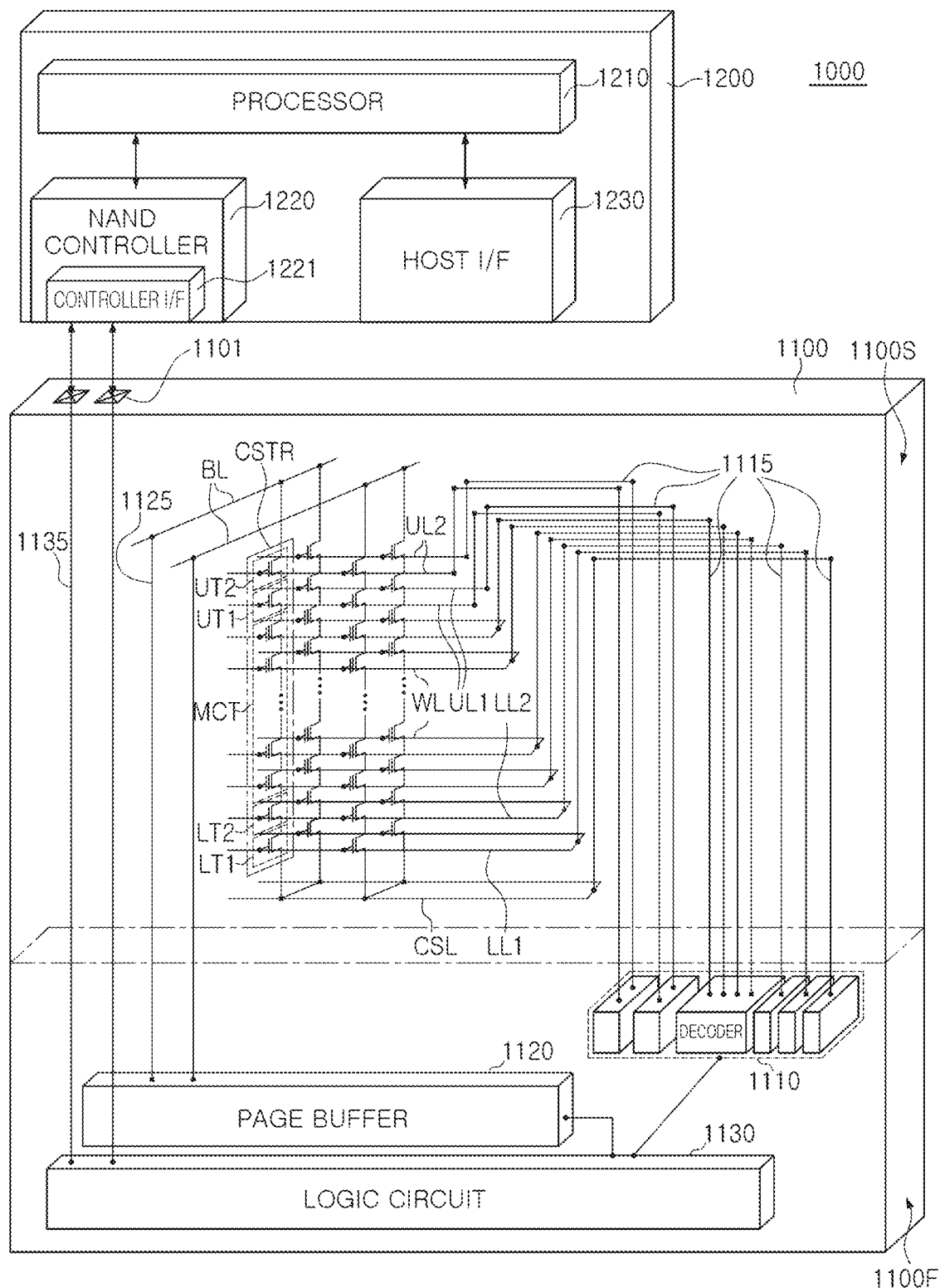
FIG. 28 is a view schematically illustrating a data storage system including a semiconductor device according to an example embodiment of the present inventive concept.
Figure 29:
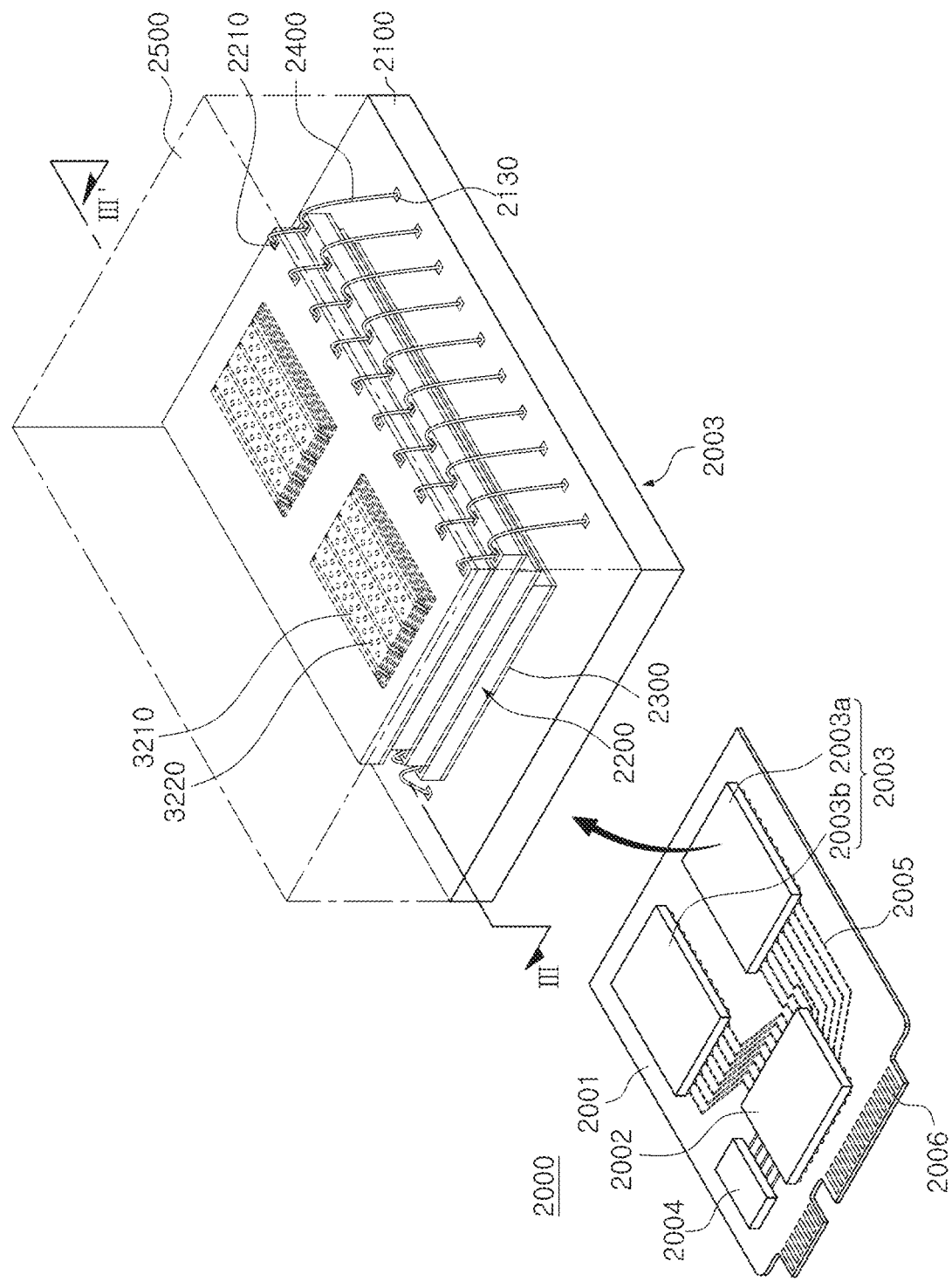
FIG. 29 is a perspective view schematically illustrating a data storage system including a semiconductor device according to an example embodiment of the present inventive concepts.

Next, a data storage system including a semiconductor device according to an example embodiment of the present inventive concepts will be described with reference to FIGS. 28 and 29, respectively. FIG. 28 is a view schematically illustrating a data storage system including a semiconductor device according to an example embodiment of the present inventive concepts, and FIG. 29 is a perspective view schematically illustrating a data storage system including a semiconductor device according to an example embodiment of the present inventive concepts.

Referring to FIG. 28, a data storage system 1000 may include a semiconductor device 1100, and a controller 1200 electrically connected to the semiconductor device 1100 and controlling the semiconductor device 1100. The data storage system 1000 may be a storage device including the semiconductor device 1100, or an electronic device including the storage device. For example, the data storage system 1000 may be a solid state drive device (SSD), a universal serial bus (USB), a computing system, a medical device, or a communication device, including the semiconductor device 1100.

In an example embodiment, the data storage system 1000 may be an electronic system storing data.

The semiconductor device 1100 may be a semiconductor device according to any one of the example embodiments described above with reference to FIGS. 1 to 27. The semiconductor device 1100 may include a first structure 1100F, and a second structure 1100S on the first structure 1100F.

The first structure 1110F may include the peripheral circuit structure 3 described above, and the second structure 1100S may include the plate layer 15, the pattern structure 19, the upper pattern layer 27, the upper structure 59 or 159, the vertical memory structures 65, the vertical support structures 75 and the separation structures 89 or 189, described above.

The first structure 1100F may be a peripheral circuit structure including a decoder circuit 1110, a page buffer 1120, and a logic circuit 1130. For example, the first structure 1100F may include the peripheral circuit 9 described above. The peripheral circuit 9 may be a transistor constituting the peripheral circuit structure including the decoder circuit 1110, the page buffer 1120, and the logic circuit 1130.

The second structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

The plate layer 15 and the first pattern layer 19a, described above, may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to example embodiments.

In some example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

The lower and upper gate layers 33g and 48g, described above, may constitute the lower gate lines LL1 and LL2, the word lines WL, and the upper gate lines UL1 and UL2.

In some example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F into the second structure 1100S.

The bit lines BL may be electrically connected to the page buffer 1120 through second connection wirings 1125 extending from the first structure 1100F into the second structure 1100S. The bit lines BL may be the bit lines (327 of FIGS. 26 and 27) described above.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130.

The semiconductor device 1100 may further include an input/output pad 1101. The semiconductor device 1100 may communicate with the controller 1200 through the input/output pad 1101 electrically connected to the logic circuit 1130. The input/output pad 1101 may be electrically connected to the logic circuit 1130 through input/output connection wirings 1135 extending from the first structure 1100F into the second structure 1100S. Therefore, the controller 1200 may be electrically connected to the semiconductor device 1100 through the input/output pad 1101, and may control the semiconductor device 1100.

The controller 1200 may include a processor 1210, a NAND controller 1220, and a host interface 1230. According to some example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

FIG. 29 is a perspective view schematically illustrating a data storage system including a semiconductor device according to an example embodiment.

Referring to FIG. 29, a data storage system 2000 according to an example embodiment of the present inventive concepts may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In some example embodiments, the data storage system 2000 may be communicated with the external host according to any one interface of a universal serial bus (USB), peripheral component interconnection express (PCI-Express), serial advanced technology attachment (SATA), M-Phy for universal flash storage (UFS), or the like. In some example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003*a* and 2003*b*, spaced apart from each other. Each of the first and second semiconductor packages 2003*a* and 2003*b* may be a semiconductor package including a plurality of semiconductor chips 2200. Each of the semiconductor chips 2200 may include the semiconductor device according to any one of the example embodiments described above with reference to FIGS. 1 to 27. For example, each of the semiconductor chips 2200 may include vertical memory structures 3220, which may correspond to the vertical memory structures 65 described above, and separation structures 3210, which may correspond to the separation structures 89, 189, or 289, described above, respectively.

Each of the first and second semiconductor packages 2003*a* and 2003*b* may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210.

In some example embodiments, the connection structure 2400 may be a bonding wire electrically connecting the input/output pad 2210 and the upper package pads 2130. Therefore, in each of the first and second semiconductor packages 2003*a* and 2003*b*, the semiconductor chips 2200 may be electrically connected to each other by a bonding wire process, and may be electrically connected to the package upper pads 2130 of the package substrate 2100. According to some example embodiments, in each of the first and second semiconductor packages 2003*a* and 2003*b*, the semiconductor chips 2200 may be electrically connected to each other by a connection structure including a through silicon via (TSV), instead of a connection structure 2400 by a bonding wire process.

In some example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

According to some example embodiments of the inventive concepts, a semiconductor device including a separation structure including a lower portion extending into a plate layer and an upper portion having a width smaller than the maximum width of the lower portion may be provided. A structure of the separation structure may improve reliability for the semiconductor device.

According to some example embodiments of the inventive concepts, a semiconductor device including a separation structure including a line portion and pillar portions overlapping the line portion may be provided. A structure of the separation structure may mitigate or prevent a stack structure from being collapsed or deformed. Therefore, reliability of the semiconductor device may be improved.

Various advantages and effects of the present inventive concepts are not limited to the above, and will be more easily understood in the process of describing specific example embodiments of the present inventive concepts.

While some example embodiments have been illustrated and described above, it will be apparent to those skilled in the art that modifications and variations could be made without departing from the scope of the present inventive concepts as defined by the appended claims.

What is claimed is:

1. A semiconductor device comprising:
   a plate layer;
   a pattern structure on the plate layer;
   an upper pattern layer on the pattern structure;

an upper structure including a stack structure and a capping insulating structure, the stack structure being on the upper pattern layer and including interlayer insulating layers and gate layers alternately stacked on each other, the capping insulating structure covering at least a portion of the stack structure;

separation structures penetrating through the upper structure, the upper pattern layer, and the pattern structure, and extending into the plate layer; and vertical memory structures penetrating through the upper structure, the upper pattern layer, and the pattern structure between the separation structures, extending into the plate layer, and contacting the plate layer, wherein each of the separation structures includes a lower portion and an upper portion on the lower portion, the lower portion includes a first lower portion, a second lower portion, and a third lower portion, the first lower portion is in the plate layer and contacts the plate layer, the second lower portion penetrates through the pattern structure, the third lower portion penetrates through the upper pattern layer, the upper portion penetrates through the upper structure, and a maximum width of the first lower portion is different from a maximum width of the third lower portion.

2. The semiconductor device of claim 1, wherein the stack structure includes a lower stack structure and an upper stack structure on the lower stack structure, the lower stack structure includes lower interlayer insulating layers and lower gate layers alternately stacked on each other, the upper stack structure includes upper interlayer insulating layers and upper gate layers stacked alternately on each other, and a side surface of each of the vertical memory structures includes a slope change portion in which a side slope changes, at a height level between a lowermost upper gate layer among the upper gate layers and an uppermost lower gate layer among the lower gate layers.

3. The semiconductor device of claim 2, wherein a side surface of each of the separation structures includes a slope change portion, in which a side slope changes, at a height level between the lowermost upper gate layer among the upper gate layers and the uppermost lower gate layer among the lower gate layers.

4. The semiconductor device of claim 1, wherein in plan view, in each of the separation structures, a side shape of the first lower portion is different from a side shape of the upper portion.

5. The semiconductor device of claim 1, wherein in plan view, in each of the separation structures, a side surface of the first lower portion has a straight linear shape, and a side surface of the upper portion has a wavy shape.

6. The semiconductor device of claim 1, wherein in plan view, in each of the separation structures, a side surface of the first lower portion has a straight linear shape, and a side surface of the third lower portion has a wavy shape.

7. The semiconductor device of claim 1, wherein the separation structures include first separation structures parallel to each other, and a second separation structure and a third separation structure between the first separation structures, an upper portion of the second separation structure and an upper portion of the third separation structure are spaced apart from each other, the separation structures further include a connection portion connecting a lower portion of the second separation structure and a lower portion of the third separation structure, and the stack structure includes a portion between the upper portion of the second separation structure and the upper portion of the third separation structure.

8. The semiconductor device of claim 1, wherein the separation structures include first separation structures parallel to each other, and a second separation structure and a third separation structure between the first separation structures and being in a row, and a portion of the plate layer is between the second separation structure and the third separation structure.

9. The semiconductor device of claim 1, further comprising:

a peripheral circuit structure below the plate layer, wherein at least a portion of the plate layer is between the peripheral circuit structure and the upper structure, and the peripheral circuit structure includes a semiconductor substrate and a peripheral circuit on the semiconductor substrate.

10. The semiconductor device of claim 1, further comprising:

a peripheral circuit structure on the upper structure, wherein the peripheral circuit structure includes a semiconductor substrate and a peripheral circuit on the semiconductor substrate, and the peripheral circuit is between the semiconductor substrate and the upper structure.

11. The semiconductor device of claim 1, wherein at least one of the separation structures includes a line portion extending in a first direction, and pillar portions connected to the line portion at a different height level from the line portion, the pillar portions being spaced apart from each other in the first direction.

12. The semiconductor device of claim 1, wherein the stack structure includes a lower stack structure and an upper stack structure on the lower stack structure, the lower stack structure includes lower interlayer insulating layers and lower gate layers alternately stacked on each other, the upper stack structure includes upper interlayer insulating layers and upper gate layers alternately stacked on each other, and a first separation structure among the separation structures includes a lower line portion passing through the lower gate layers, an upper line portion passing through the upper gate layers, and an intermediate pillar portion spaced apart from each other between the lower line portion and the upper line portion.

13. The semiconductor device of claim 12, wherein the first separation structure of the separation structures further include upper pillar portions spaced apart from each other on the upper line portion.

14. A semiconductor device comprising:

a plate layer;

an upper structure including a stack structure and a capping insulating structure covering at least a portion of the stack structure, the stack structure on the plate layer and including interlayer insulating layers and gate layers alternately stacked on each other;

separation structures penetrating through at least a portion of the upper structure; and vertical memory structures penetrating through the upper structure between the separation structures, wherein a first separation structure among the separation structures includes a first line portion extending in a first direction and being parallel to an upper surface of the plate layer, and a plurality of first pillar portions being at a different height level from the first line portion and spaced apart from each other in the first direction, and the plurality of first pillar portions are at a level lower than that of an uppermost gate layer among the gate layers, and at a level higher than that of a lowermost gate layer among the gate layers.

15. The semiconductor device of claim 14, further comprising:

a support structure overlapping the first line portion and being between the plurality of first pillar portions, wherein at least a portion of the support structure is at a same level as at least a portion of an interlayer insulating layer among the interlayer insulating layers.

16. The semiconductor device of claim 14, wherein the stack structure includes a lower stack structure and an upper stack structure on the lower stack structure, the lower stack structure includes lower interlayer insulating layers and lower gate layers alternately stacked on each other, the upper stack structure includes upper interlayer insulating layers and upper gate layers alternately stacked on each other, the first line portion penetrates through the lower gate layers, and the plurality of first pillar portions extend from the first line portion in a vertical direction perpendicular to an upper surface of the plate layer.

17. The semiconductor device of claim 16, wherein the first separation structure further includes a second line portion penetrating through the upper gate layers and extending in the first direction, and upper pillar portions being on the second line portion and spaced apart from each other in the first direction.

18. A data storage system comprising:

a semiconductor device including an input/output pad; and a controller electrically connected to the semiconductor device through the input/output pad and configured to control the semiconductor device, the semiconductor device including, a plate layer, a pattern structure on the plate layer, an upper pattern layer on the pattern structure, an upper structure including a stack structure and a capping insulating structure covering at least a portion of the stack structure, the stack structure on the plate layer and including interlayer insulating layers and gate layers alternately stacked on each other, separation structures penetrating through the upper structure, the upper pattern layer, and the pattern structure, and extending into the plate layer, and vertical memory structures penetrating through the upper structure, the upper pattern layer, and the pattern structure between the separation structures, extending into the plate layer, and contacting the plate layer, wherein each of the separation structures includes a lower portion and an upper portion on the lower portion, the lower portion includes a first lower portion, a second lower portion, and a third lower portion, the first lower portion is in the plate layer and contacts the plate layer, the second lower portion penetrates through the pattern structure, the third lower portion penetrates through the upper pattern layer, the upper portion penetrates through the upper structure, and a maximum width of the first lower portion is different from a maximum width of the third lower portion.

19. The data storage system of claim 18, wherein, in plan view, in each of the separation structures, a side surface of the first lower portion has a straight linear shape, and a side surface of the upper portion has a wavy shape.

20. The data storage system of claim 18, wherein at least one of the separation structures includes a line portion extending in a first direction, and pillar portions connected to the line portion at a different height level from the line portion, the pillar portions being spaced apart from each other in the first direction.

* * * * *